United States Patent [19]
Staral et al.

[11] Patent Number: 5,897,727
[45] Date of Patent: Apr. 27, 1999

[54] METHOD FOR ASSEMBLING LAYERS WITH A TRANSFER PROCESS USING A CROSSLINKABLE ADHESIVE LAYER

[75] Inventors: John S. Staral, Woodbury; Naimul Karim, Maplewood; Thomas A. Isberg, Apple Valley; Terrance P. Smith; Kevin E. Kinzer, both of Woodbury, all of Minn.

[73] Assignee: Minnesota Mining and Manufacturing Company, St. Paul, Minn.

[21] Appl. No.: 08/710,611

[22] Filed: Sep. 20, 1996

[51] Int. Cl.$^6$ ..................................................... B32B 31/28
[52] U.S. Cl. ....................... 156/99; 156/151; 156/275.5; 156/275.7; 349/106
[58] Field of Search ........................... 349/106; 156/151, 156/241, 275.5, 275.7, 277, 99, 107

[56] References Cited

U.S. PATENT DOCUMENTS

| | | | |
|---|---|---|---|
| 3,723,392 | 3/1973 | Konig et al. | 260/75 NP |
| 3,787,210 | 1/1974 | Roberts | 96/27 E |
| 4,156,046 | 5/1979 | Lien et al. | 428/220 |
| 4,587,169 | 5/1986 | Meloy | 264/102 |
| 4,846,905 | 7/1989 | Tarbutton et al. | 525/65 |
| 4,923,860 | 5/1990 | Simons | 503/227 |
| 4,950,696 | 8/1990 | Palazzotto et al. | 522/25 |
| 4,962,081 | 10/1990 | Harrison et al. | 503/227 |
| 4,965,242 | 10/1990 | DeBoer et al. | 503/227 |
| 4,975,410 | 12/1990 | Weber et al. | 503/227 |
| 4,985,340 | 1/1991 | Palazzotto et al. | 430/270 |
| 5,059,701 | 10/1991 | Keipert | 556/13 |
| 5,073,534 | 12/1991 | Harrison et al. | 503/227 |
| 5,086,086 | 2/1992 | Brown-Wensley et al. | 522/25 |
| 5,156,938 | 10/1992 | Foley et al. | 430/200 |
| 5,166,126 | 11/1992 | Harrison et al. | 503/227 |
| 5,171,650 | 12/1992 | Ellis et al. | 430/20 |
| 5,214,541 | 5/1993 | Yamasita et al. | 430/7 |
| 5,252,694 | 10/1993 | Willett et al. | 525/404 |
| 5,262,232 | 11/1993 | Wilfong et al. | 428/327 |
| 5,308,737 | 5/1994 | Bills et al. | 430/201 |
| 5,318,938 | 6/1994 | Hampl, Jr. et al. | 503/200 |
| 5,411,806 | 5/1995 | Dahlquist | 428/411.1 |
| 5,437,912 | 8/1995 | Chou et al. | 428/195 |
| 5,521,035 | 5/1996 | Wolk et al. | 430/20 |
| 5,544,582 | 8/1996 | Bocko et al. | 156/277 |
| 5,614,350 | 3/1997 | Ito et al. | 430/257 |
| 5,635,317 | 6/1997 | Taniguchi et al. | 430/7 |

FOREIGN PATENT DOCUMENTS

| | | |
|---|---|---|
| 0 109 851 | 6/1984 | European Pat. Off. . |
| 0 646 632 A1 | 4/1995 | European Pat. Off. . |
| 2 639 084 | 3/1978 | Germany . |
| 2 706 297 | 8/1978 | Germany . |
| 2 714 084 | 10/1978 | Germany . |
| 2 714 104 | 10/1978 | Germany . |
| 2 721 186 | 11/1978 | Germany . |
| 2 738 154 | 3/1979 | Germany . |
| 2 738 512 | 3/1979 | Germany . |
| 60-222241 | 11/1985 | Japan . |
| 61-32749 | 2/1986 | Japan . |
| 61-147231 A | 7/1986 | Japan . |
| 62-144943 | 6/1987 | Japan . |
| 62-180329 | 8/1987 | Japan . |
| 63-60793 | 3/1988 | Japan . |
| 1-149003 | 6/1989 | Japan . |
| 02213006 | 8/1990 | Japan . |
| 2-213006 | 8/1990 | Japan . |
| 03132717 | 6/1991 | Japan . |
| 04255693 | 9/1992 | Japan . |
| 05181123 | 7/1993 | Japan . |
| 5-177757 | 7/1993 | Japan . |
| 6-91223 | 4/1994 | Japan . |
| 08080980 | 3/1995 | Japan . |
| 7-104113 | 4/1995 | Japan . |
| 08160424 | 6/1996 | Japan . |
| 8-220330 | 8/1996 | Japan . |
| 2 083 726 A | 3/1982 | United Kingdom . |
| WO 84/03837 | 10/1984 | WIPO . |

OTHER PUBLICATIONS

*Bull. Am. Phys. Soc.,* vol. 1, No. 123 (1956).
Bruins, P., *Epoxy Resin Technology,* (1968).
Frisch et al., *Ring–Opening Polymerizations,* vol. 2 (1969).
Hase, T. et al., "Phosphor Materials for Cathode–Ray Tubes," *Advances in Electronics and Electron Phy.,* vol. 79, pp. 271–373 (Academic Press, 1990).
*Kunststoff–Handbuch,* vol. VII, pp. 45–71 (1966).
Latham, W.J. et al., "Color Filters from Dyed Polyimides," *Solid State Tech.* (May 1988).
Lee et al., *Handbook of Epoxy Resins,* (1967).
Leitz tilting compensator manual, publication 313.550–057.
Murov, S.L., *Handbook of Photochemistry,* Marcel Dekker Inc., N.Y., pp. 27–35 (1973).
Saunders, "Polyurethanes, Chemistry and Technology," *High Polymers,* vol. XVI; vol. I, pp. 32–42, 44–54 (1962).
Saunders, "Polyurethanes, Chemistry and Technology," *High Polymers,* vol. XVI; vol. II, pp. 5–6, 198–199 (1964).

*Primary Examiner*—Michael W. Ball
*Assistant Examiner*—Michael A. Tolin
*Attorney, Agent, or Firm*—William D. Miller

[57] ABSTRACT

Optical elements are prepared by the adhesive transfer of at least a low temperature curable (e.g., radiation or room temperature curable, preferably pressure-sensitive) adhesive layer and a conductive layer to a substrate, preferably a transparent, non-birefringent substrate such as ceramic, glass or polymeric film having, for example, a color filter array thereon. The (pressure-sensitive) curable adhesive is cured after the curable adhesive layer has been placed into contact with a final receptor surface (e.g., a color filter array on a liquid crystal panel).

25 Claims, No Drawings

METHOD FOR ASSEMBLING LAYERS WITH A TRANSFER PROCESS USING A CROSSLINKABLE ADHESIVE LAYER

BACKGROUND OF THE INVENTION

1. Field of the Invention

This invention relates to methods for using the transfer of materials and layers to prepare optically useful elements, such as liquid crystal display (LCD) panels. In particular, this invention relates to a method for assembling a planarization and/or indium-tin-oxide layer in an optical element such as a color filter element for use in liquid crystal display devices. An adhesive layer comprising a crosslinkable adhesive layer which may be a pressure-sensitive or low temperature softening thermal adhesive layer is used in the transfer process, this adhesive layer also having the capability of performing as a planarization layer in the final article.

2. Background of the Art

Liquid crystal display devices have competed with phosphorescent display systems and have created their own unique markets. Liquid crystal displays are commonly found in digital imaging systems such as watches, calculators, computer displays, audio/video equipment, and other electric appliances to provide the readable image. Liquid crystal displays provide excellent properties which enable them to compete with other display technologies, and among these properties are low power requirements, small volume needs, little heat generation, and acceptable resolution. Liquid crystal arrays have had to provide color display capability to satisfy the wide range of desirable markets for their use, and coloration has been provided by associating color filters (e.g., flat panel color filters or displays) with the liquid crystals. These color filters transmit only selected and limited wavelengths of radiation (by absorbing the undesired wavelengths), thus allowing light of specified color to pass from the liquid crystal. To provide the best results, color filters are adhered to the surface of liquid crystal display devices as opposed to being merely suspended over the display area of the liquid crystal device. The entire liquid crystal display system usually comprises more than one or two layers. Including the color filter device, the system will generally comprise a first substrate (e.g., glass plate), conductive layer, alignment layer, liquid crystal layer, second alignment layer, conductive layer, planarization layer, color array, black matrix, and second substrate (e.g., second glass plate).

As shown in U.S. Pat. No. 5,166,126, a binder layer between the conductive layer and the second alignment layer may be present. The physical process of associating of these layers into a single article can be complex. The deposition of the conductive layer, when made of indium-tin-oxide materials, can be particularly difficult because of the temperatures generated from necessary heat treatment of the layer during annealing.

U.S. Pat. No. 5,166,126 uses an adhesive thermal buffer layer between the conductive layer and the liquid crystal display device to reduce the temperature impact of the deposition and treatment of the conductive layer.

U.S. patent application Ser. No. 08/273,419, filed Jul. 11, 1994 and U.S. Pat. No. 5,521,035 disclose the use of thermal mass and thermal dye transfer processes to manufacture color filter display panels by the transfer of colorant (dye and/or pigment, with or without a binder) onto a panel to lay over the liquid crystal display.

A series of patents (U.S. Pat. Nos. 4,965,242, 4,962,081, 4,975,410, 4,923,860, 5,073,534, and 5,166,126) have been assigned to Kodak which disclose the use of thermal dye diffusion transfer to make filter elements and color filter constructions. U.S. Pat. Nos. 4,965,242 and 5,073,534 teach the use of high Tg polycarbonate and polyester receiving layers to accept the thermally transferred dye. With both receiving layers, a vaporous solvent treatment is required to drive the dye into the receiving layer.

For a color filter element to be useful as a component of certain types of optical display devices, including for example liquid crystal and phosphorescent displays, the color filter array is preferably coated with a planarizing layer. This planarizing layer (which, amongst other objectives, levels or smooths the surface of the color filter element for acceptable placement of subsequent layers) is usually followed by a coating of a transparent conductor, commonly indium tin oxide (ITO). The conductive layer may or may not be patterned, and is preferably a continuous layer. Finally, an alignment layer, typically a resin such as a polyimide, is applied onto the conductive layer. The alignment layer is typically patterned (e.g., by brushing) to control the alignment of the liquid crystal material in the functioning display.

The substrate may be any substance upon which a color filter or the like is desired to be formed. Preferably the substrate is a transparent (at least light transmissive) substrate, such as glass, polymer film, and the like. When glass is the substrate, the use of glass treated with silane (e.g., 3-aminopropyltriethoxysilane) or titanate coupling agents may be useful to increase adhesion of the colorant layer. Possible substrates include glass, polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports in various imaging arts. Transparent polymeric film base of 2 to 100 mils (e.g., 0.05 to 2.54 mm) is preferred. If the substrate is a polymeric film, it is preferred that the film be non-birefringent so as not to interfere with the operation of the display in which it may be integrated. Preferred examples of non-birefringent substrates are polyesters that are solvent cast. Typical examples of these are those derived from polymers consisting or consisting essentially of repeating, interpolymerized units derived from 9,9-bis-(4-hydroxyphenyl)-fluorene and isophthalic acid, terephthalic acid or mixtures thereof, the polymer being sufficiently low in oligomer (i.e., chemical species having molecular weights of about 8000 or less) content to allow formation of a uniform film. This polymer has been disclosed as one component in a thermal transfer receiving element in U.S. Pat. No. 5,318,938. Another class of non-birefringent substrates are amorphous polyolefins (e.g., Zeonex™ from Nippon Zeon Co., Ltd.). The most preferred substrate is glass. It is preferred that this glass be 0.5 to 2.0 mm thick. Especially preferred thicknesses are between 0.5 and 1.5 mm, such as 0.7 and 1.1 mm.

The colors to be deposited on the substrate sheet for the color filter element may comprise any color material which can be deposited with adherence to the substrate. In a preferred embodiment, the colorant is in a suitable binder system and is solvent coated.

When pigments are used as the color material, they are preferably transparent. Examples of transparent pigments that can be used in this invention include Sun RS Magenta 234-0077™, Hoechst GS Yellow GG11-1200™, Sun GS Cyan 249-0592™, Sun RS Cyan 248-0615™, Ciba-Geigy BS Magenta RT-333D™, Ciba-Geigy Microlith Yellow 3G-WA™, Ciba-Geigy Microlith Yellow 2R-WA™, Ciba-Geigy Microlith Blue YG-WA™, Ciba-Geigy Microlith Black C-WA™, Ciba-Geigy Microlith Violet RL-WA™, Ciba-Geigy Microlith Red RBS-WA™, any of the Heucotech Aquis II™ series, any of the Heucosperse Aquis III™ series, and the like. A preferred method of inserting or depositing the colors on the matrix is by laser induced mass transfer, including a "melt stick" and/or an ablative transfer process in which a donor sheet having the colors thereon is used to transfer colors onto the substrate. "Ablative transfer" refers to a process in which a medium is ablated in thermal imaging processes by the action of a thermal source, through the rapid removal of material from the surface, but without sublimation of the material. Such donor sheets are known in the art for direct image forming.

Thermal mass transfer of colorant onto a support is a significant improvement over dye (e.g., sublimation) transfer in forming color filter elements. The colors are more durable with respect to both abrasion and color fading (when pigments are used). The transferred mass material carries its own binder and can be applied to a greater range of substrate materials. No post-treatment of the transferred mass colorant is needed as may be required for dye transferred materials used in color filters of the prior art (e.g., U.S. Pat. Nos. 4,965,242 and 5,073,534).

The colors used to form the color filter are generally the primary additive colors, i.e., red, green, and blue. Each of these primary colors preferably has high color purity and transmittance, and, when combined, an appropriate white balance. The color filters preferably have spectral characteristics of red, green, and blue that show chromaticity close to the National Television Standards Committee (NTSC) standard colors indicated by the Commission International de l'Eclairage (CIE) chromaticity diagram. Although red, green, and blue are the most common colors for the filters, other color combinations may be used for specialty applications. In some cases, the repeat sequence in a row is red:green:blue. For other applications the repeat sequence in a row is red:green:green:blue.

A general description of color filters for liquid crystal displays is given in C. C. O Mara, Liquid Crystal Flat Panel Display: Manufacturing Science and Technology, Van Norstrand Reinhold, 1993 p. 70. Several fabrication methods are disclosed. The most common method for preparing color filters is using photolithographic techniques. One photolithographic process is detailed in an article entitled "Color Filters from Dyed Polyimides" W. J. Latham and D. W. Hawley, Solid State Technology, May 1988. This paper shows the complex, multi-step nature of the photolithographic process.

The shapes of the color elements may be simple geometric objects such as rectangles, squares or triangles. Alternatively, for some configurations of color filters, the color elements may be created as stripes. Another common configuration for a color filter array is when the color elements in one row are displaced by one element in the second row and by two elements in the third row such that the color elements are diagonally aligned.

The dimensions of the discrete elements can range from 5–1000 microns.

More typically the dimensions are on the order of 50–300 microns. These dimensions are easily produced by photolithographic and laser imaging techniques.

There are many transparent electrically conducting laminate elements described in the literature. A Kokai Patent Application No. HEI 5[1993]-177757 discloses a light shield film comprising a laminate construction containing the following layers in the order listed: 1) a transparent film base, a heating layer which in the examples is an ITO layer, a moisture proof $SiO_2$ layer, a sol-gel layer which undergoes a transition from a transparent to scattering when heated, and another transparent film. Kokai Patent Application No. HEI 2[1990]-213006 (Nitto Electric Corp.) teaches the construction of transparent, conductive laminates. These films are prepared by depositing a conductive film on one side of a transparent film substrate and a dielectric layer onto the conductive layer; the other side of the substrate layer is then coated with a transparent adhesive. The dielectric layer serves the dual purpose of protecting the conductive layer from scratching and also reduces reflection from the surface. The adhesives discussed are acrylics, for example a copolymer of butylacrylate, acrylic acid and vinyl acetate which has been crosslinked with an isocynate type crosslinking agent. The final construction is prepared by bonding the adhesive layer to a thicker transparent support layer such as a polyester. The adhesive properties are chosen to provide a cushioning effect. Kokai Patent Application No. HEI 1[1989]-149003 discloses laminates for VDT filters. The laminates are prepared by bonding a number of layers together using a crosslinkable ethylene copolymer adhesive. The ethylene copolymers include ethylene-vinylacetate, ethylene-methacrylate copolymer, ethylene methacrylic acid copolymer, ethylene-ethylmethacrylate copolymer, ethylene methylacrylate copolymer, metal ion crosslinked ethylene-ethylmethacrylic acid copolymer, partially saponified ethylene-vinyl acetate copolymer, and carboxylated ethylene vinyl acetate copolymer. The crosslinking of these polymers can be accomplished using heat or light. One method detailed in the patent application is the use of these polymers with an initiator system consisting of organic peroxides. The multifunctional acrylates, or allyl oligomers can also be used in this invention. Adhesion promoters such as silane coupling agent containing epoxy groups or acrylates may also be present. For light induced crosslinkable systems a sensitizer is provided. In order to prevent blocking it was necessary to emboss the adhesive surface. Another Kokai Patent Application No. SHO 62[1987]-180329 involves a construction discloses the use of a laminate construction comprising a transparent conductive layer, polymeric substrate layer, an optional primer layer, a ethylene-vinyl alcohol containing layer, and a thermoset containing layer. The purpose of the thermoset layer is to protect the EVA layer in subsequent etching steps performed on the ITO layer. Other laminate constructions are described in Kokai Patent Application No. Sho 60[1985]-222241 wherein a transparent substrate layer is coated with a curable composition to improve the hardness of the laminate construction. In all the examples the curable layer is completely cured and as such is not suitable for laminating to another optical element without application of an adhesive. Other less relevant laminate constructions are described in Kokai Patent Application No. Sho 61[1986]-32749 and Kokai Patent Application No. Sho 62[1987]-144943.

In Kokai Patent Application No. Hei 6[1994]-91223 the use of a release material is disclosed in a method for smoothing polymeric films to prevent the formation of irregular patterns. The specific example cited is the formation of a planarized surface on a color filter element. The process involves bonding a resin film on a base or substrate layer and then depositing a release film (smoothing layer) on top of the resin layer by applying pressure and heat to smooth the surface. The release film is then removed. The release layer is comprised of a base layer, a conductive layer and an adhesive layer (on the conductive layer). The base layer and conductive layer of the smoothing film are stripped from the color filter element. This differs from the inventions described herein in which the conductive layer remains with the color filter element. Also the conductive layer need not be transparent in their invention as carbon black is listed as a possible conductive layer.

There is also a Kodak patent that discuss laminate ITO layers with an associated color filter, U.S. Pat. No. 4,965, 242. In this construction, a temporary support layer is laminated to a polymeric alignment layer on top of a transparent conducting layer. In this case, the polymeric alignment layers are polyimides, polyvinylalcohols and methyl cellulose. The temporary support layer is a Kaptan resin (a polymer of the diimide of pyromellitic acid and 4,4'-oxydianiline).

SUMMARY OF THE INVENTION

A requirement for many display applications is an optically transparent, electrically conducting layer. For the most part, this layer is constructed in a step-wise fashion wherein one of the steps is a vapor deposition of the electrically conductive layer, usually indium tin oxide (ITO) because of its unique optical clarity, thermal stability and oxidative stability. Another step in the application of these electrically conductive layers involves an annealing process, often at high temperatures, to obtain suitable conductive properties in the layer. The deposition of the ITO and subsequent annealing place severe restrictions on the nature of the materials that may be used in layered structures which must be exposed to these process steps. For example, in the case of color filters, the specific binders and the colorants are limited by the temperatures required for annealing. There is a need for a transparent colorless layer that can be adhered to an optical element such as a color filter element at lower temperatures (<200° C.) so that the substrate and associated materials are not thermally damaged or impaired.

The present invention describes two articles and two associated processes for assembling optically useful elements. The first article to be used in a direct lamination process comprises in the following sequence at least 1) an optically transparent, electrically conducting film layer, 2) a (preferably non-birefringent) support film, and 3) a crosslinkable (preferably but not essentially a pressure-sensitive or thermally tackifiable) adhesive layer, with an optional release liner on the adhesive layer (when it is tacky or pressure-sensitive or premade with the conductive layer in a roll or sheet supply) such that the release layer can be stripped-off and the optically transparent, electrically conducting film applied to the optical element. The support film is non-birefringent where optical properties desired in the final article require that property. An optical alignment layer may be over the optically transparent electrically conducting film layer. The second article to be used in a lamination-and-stripping process comprises in sequence 1) an optional strippable carrier layer, 2) transparent conductive layer, and 3) a crosslinkable pressure-sensitive or thermally tackiflable (becomes sufficiently tacky at ≧30° C. to secure the adhesive layer while the adhesive layer cures to more permanently secure the adhesive to the final substrate) adhesive layer. Again an optional strippable layer may be placed over the adhesive. In practice, the adhesive layer of both articles is placed against the optical surface to which the conductive element is to be affixed, and any strippable layers (as in the second article) removed. An optional alignment layer may be placed between the conductive layer and the release surface of the second article, thereby providing a three-layer or four-layer transferable system of (from the outermost layer after transfer) an alignment layer, conductive layer, (non-birefringent substrate in the first article) and adhesive layer. The unique features of this invention are the aforementioned constructions and the functional nature of the pressure-sensitive crosslinkable adhesive layers used to bond the optically transparent, electrically conducting film to the optical element. The advantage of the constructions of this invention are that an optically transparent, electrically conducting film may be prepared and annealed prior to attachment to the optical element, a photocurable or other low temperature curing adhesive is used to associate the annealed layer to the optical element (e.g., liquid crystal display panel) and therefore the optical element need not be exposed to damaging temperatures. Another aspect to this invention is the possibility of creating this transferable element using web processing techniques which offer the advantage of significant cost reductions. Other aspects to this invention are the use of special optically clear, multi-component adhesives that can be transformed into crosslinked (variously known as thermoset, three-dimensional, cured, or photocured) polymers that will not separate into optically distorting phases.

"Crosslinkable pressure-sensitive adhesives" refers to a pressure sensitive adhesive comprising at least one component which may be crosslinked to change the physical properties (e.g., viscosity, flexibility, Tg) of the adhesive layer.

The two processes of the present invention comprise the use of these two different elements in processes wherein the adhesive layer is contacted with the ultimate substrate and the adhesive cured in contact with that ultimate substrate. It is possible to initiate cure of the crosslinkable layer before placing the adhesive layer against the permanent substrate, as some adhesive systems have a delayed cure time. This is not particularly advantageous, but has actually been performed with some of the benefits of the present invention. The biggest drawback of this effort is the tendency for the adhesive to be less flowable as crosslinking progresses, which reduces penetration of the adhesive into any open areas (e.g., between raised image features in the color filter). Careful viscosity controls and appropriate timing during the curing process can alleviate these problems.

DETAILED DESCRIPTION OF THE INVENTION

The present invention relates to processes and materials for the formation of optical elements which may comprise a substrate having adhered thereto at least an adhesive layer and an electrically conductive layer, the substrate having an optional alignment layer over the conductive layer (on the side of the conductive layer opposite to the position of the adhesive layer) and/or an optional support film intermediate between the electrically conducting film layer and the crosslinkable pressure sensitive adhesive layer. Both the adhesive layer and conductive layer become adhered to the substrate by an adhesive transfer process with crosslinking of the adhesive completed after the transfer step. The adhesive layer may have some crosslinking prior to transfer, but the amount of crosslinking should not interfere with its ability to function as an adhesive and to laminate or secure itself to the ultimate substrate during the process of the invention. The adhesive layer should also significantly crosslink after the transfer step to assure the best properties in the layer which are most likely to result only from a higher degree of crosslinking than that which would allow for thermal bonding of a partially crosslinked layer. One manner of effecting this lamination process is with a two or three layer conductive element (conductive layer, optional polymeric intermediate and crosslinkable (preferably pressure-sensitive or thermally tackifiable) adhesive layer). A temporary or carrier layer may be used on the element without the intermediate layer and/or on an adhesive layer in the two or three layer conductive element (with release properties, as provided by a release layer or release coating on the temporary carrier or natural disaffinity between the substrate and the next adjacent layer). Optionally, one may coat an alignment layer onto the conductive layer on the opposite side of the adhesive. This alignment layer may be first deposited on a temporary layer and the conductive layer deposited over that alignment layer. Depositing may be done by any process such as for example, vapor deposition, sol drying, etc. for the electrically conductive layer (e.g., Indium-Tin-Oxide, Alumina/ITO, ITO/Ag/ITO, mixtures, solid solutions and blends of metals and metal oxides, conductive non-metallic oxides, preferably transparent layers of these materials, etc.) onto the temporary substrate (over the alignment layer if present), overlay a curable (crosslinkable) pressure-sensitive layer on the conductive layer, place the curable layer against the substrate, then curing the curable layer. The temporary layer may be removed before the curing step, but even if the curing process is initiated by irradiation the process may be performed without stripping of the temporary layer if the temporary layer is transparent or if the substrate is transparent and the radiation is directed through the transparent layer. This may be accomplished and the temporary layer may be stripped after photoinitiation. It should be apparent that the adhesive layers of the present invention preferably are not sufficiently liquid as to be able to flow at room temperature (e.g., 20° C.) unless they are being used during an in-line operation of the process (e.g., where coating immediately precedes application of the composite conductive elements to the final optical element substrates) and the adhesive should preferably not flow (move at a rate of 1cm/min.) under mild shear forces (e.g., placing a polyester film in contact with the adhesive, apply 0.5 lb/in² vertical pressure component, and a horizontal force component of 200 g/10 cm² of film area), preferably not at temperatures of 30° C., 40° C. or 50° C. An adhesive layer which meets this test at 30° C. is termed a solid adhesive in the practice of this invention.

In yet a further aspect of the present invention, curable pressure sensitive adhesives useful in the optical elements of the invention can be prepared wherein the pressure-sensitive crosslinkable adhesive comprises at least one polymerizable monomer and/or oligomer and/or polymer, that is, the adhesive when it is applied is still further polymerizable/crosslinkable. In this system, at least one of the components in the composition should be capable of being crosslinked via exposure to radiation and/or thermal energy. In a crosslinkable pressure-sensitive adhesive, preferably at least about 30%, or, more preferably, more than 50%, and, most preferably, more than 75% by weight, of the components must be capable of being crosslinked based on the total weight of the components. There are a wide variety of crosslinkable materials available which can crosslink to provide optical properties needed in optical elements. Examples of polymerizable components include those materials containing reactive functionality such as epoxide functionality, vinyl ether functionality, ethylenically-unsaturated functionality, amino functionality, carboxylic acid functionality, hydroxyl functionality, etc. Among the many classes of materials which can meet these needs, preferred are (meth)acrylates (e.g., polyacrylates and poly (meth)acrylates with more than one (meth)acryloyl functionality [e.g., 2–8 acryloyl functionalities] per molecule or with additional crosslinking agents); polyepoxy resins; polysiloxanes; and the like capable of three dimensional crosslinking. The photocurable materials may be applied as liquid coating compositions which are dried to a sufficiently stable condition to allow movement of the coated conductive layer to the substrate, or the photocurable layer may be in a solid state (as in a dry film photoresist layer) which can be adhered to the substrate at modest temperatures (e.g., less than 175° C., preferably less than 150° C., and more preferably less than 100° C.) which are far below the higher temperatures that could damage the ITO layer or the optical element.

There are two distinguishable processes useful in the practice of the present invention. A first process, called the stripping process, comprises the use of a) a strippable (or permanent) carrier layer, b) an optional alignment layer, c) the electrically conductive (preferably optically clear) layer, and the adhesive layer of the invention. The adhesive layer is a pressure-sensitive or low temperature tackifiable (becomes sufficiently tacky at temperatures of 30–150° C.) solid, i.e., non-flowable layer at room temperature and is adhered directly to the assembly for which it is intended (e.g., the color filter element) to secure the electrically conductive layer to the assembly. The carrier layer, if strippable, is then stripped after the assembly. The adhesive layer firmly bonds the electrically conductive layer to the assembly by the action of the adhesive which is either thermally adherent (at temperatures preferably below 150° C., more preferably below 125° C., still more preferably below 100° C., and most preferably below 80° C.), or pressure sensitive. The securement of the adhesive may of course also involve some modest force.

The second process involves the use of a (preferably non-birefringent) spacer. One side of the spacer layer (polymeric film) has the adhesive (which must be crosslinkable, but may be liquid, solid, pressure-sensitive, thermally tackifiable, radiation curable, or thermally curable) and the other side as the electrically conductive layer. A carrier layer may be present on either or both exterior layers, but must be eventually stripped from the adhesive layer. The adhesive layer is secured to the assembly, firmly attaching both the spacer layer and the electrically conductive layer through the adhesive. The heat used with a thermally adherent adhesive in this process should still be within the ranges described above for the first process. It is possible to initiate cure of the crosslinkable layer before placing the adhesive layer against the permanent substrate, as some adhesive systems have a delayed cure time. This is not particularly advantageous, but has actually been performed with some of the benefits of the present invention. The biggest drawback of this effort is the tendency for the adhesive to be less flowable as crosslinking progresses, which reduces penetration of the adhesive into any open areas (e.g., between raised image features in the color filter). Careful viscosity controls and appropriate timing during the curing process can alleviate these problems.

In a preferred embodiment the present invention uses a curable pressure sensitive adhesive described in U.S. Pat. No. , derived from U.S. patent application Ser. No. 08/334,692, filed on Nov. 4, 1994 and U.S. Pat. No. 5,252,694 that upon curing provides a semi-structural or structural adhesive, wherein the pressure-sensitive crosslinkable adhesive comprises: (1) at least one polymer obtained from polymerization of at least one free-radically polymerizable monomer; (2) at least one cationically-polymerizable monomer; (3) a photo-activatable catalyst system for the cationically-polymerizable monomer comprising either at least one organometallic complex salt or at least one onium salt; and (4) optionally, a monohydric or polyhydric alcohol, preferably wherein there is essentially no conversion of the cationically-polymerizable monomer of the curable pressure sensitive adhesive for at least 10 days, at 20° C., –50% RH, when stored in a manner to exclude actinic radiation which is capable of activating the catalyst system.

The curable pressure sensitive adhesive is preferably provided by the steps of:

(1) preparing a polymerizable composition comprising a mixture of
  (a) at least one free-radically polymerizable monomer,
  (b) at least one thermal free-radical initiator,
  (c) at least one cationically-polymerizable monomer,
  (d) a photo-activatable catalyst system for the cationically-polymerizable monomer comprising at least one organometallic complex salt or at least one onium salt, and
  (e) optionally, a monohydric or polyhydric alcohol; and
(2) applying sufficient thermal energy to the mixture to effect essentially complete polymerization of the thermally free-radically polymerizable monomer.

Any thermally-initiated free radical polymerization process is useful in the practice of step 2 of the present invention. For example, reactive extrusion and thermal polymerization in the presence of a heat transfer medium may be used. Advantageously, the photo-activatable cationic catalyst is not affected under the operating parameters of thermal energy application. This provides a stable pressure sensitive adhesive that upon application to a substrate can be subsequently irradiated in situ to provide a semi-structural or structural adhesive.

Preferably, the adhesives are acrylic-based, which exhibit particularly troublesome, and at times, process rate limiting polymerization exotherms.

Accordingly, the inventive process for the production of crosslinkable pressure-sensitive adhesives for transfer of the conductive layers to optical elements comprises allowing a carrier web coated with a free-radically polymerizable composition to remain in a thermal buffer for a time sufficient to effect conversion of the coating to an adhesive while controlling any reaction exotherm to maintain a reaction temperature within 20° C. of the temperature of the thermal buffer. The thermal buffer is characterized as a system for heat transfer wherein the heat transfer coefficient is at least $25W/(m^2.K)$. Depending on the particular polymerizable mixture, it may be advantageous to exclude oxygen from the polymerization zone.

The coating on the carrier web can be a substantially solvent-free thermally polymerizable mixture, wherein the polymerizable mixture preferably comprises at least one free-radically polymerizable monomer, at least one thermal initiator and optionally at least one cross-linker, at least one cationically polymerizable monomer and photo-activatable cationic catalyst system. Preferably, the free-radically polymerizable monomers are predominantly acrylic-based monomers.

In another embodiment of the present invention, a polymerizable composition is coated between a first and second carrier web (or the conductive layer and a strippable layer) to form a sandwich, and then processed as above. This preformed adhesive layer may be laminated to the Indium-Tin-Oxide layer prior to lamination of both of these layers to an optical display device. Advantageously, there is no need to eliminate oxygen from the polymerization zone. The low temperatures used in the procedure are not damaging to the layers in thermal contact with the adhesive layer.

A particularly useful feature of this invention is the use in the process of manufacturing the optical elements of an adhesive system that has the combined properties of a pressure sensitive adhesive (for easy application) and a thermosetting resin (for a strong, permanent semi-structural or structural bond and function as a planarization (protective) coating). The adhesive system comprises a crosslinkable component which imparts little optical haze to the adhesive (before or after curing) so that it may be used in optical systems. Further, the adhesive system of a preferred embodiment of the present invention exhibits a significantly longer shelf life after the pressure sensitive portion (the free radically polymerizable monomers) has been fully cured than similar compositions that are currently known in the art. Another advantage of this preferred embodiment of the present invention is that the adhesive systems may be prepared as 100% reactive coating compositions, substantially eliminating industrial solvent waste, while also reducing energy consumption.

The inventive method provides a significant advantage over the art in that initial polymerization of the free-radically polymerizable monomer(s) is accomplished in an manner that does not affect polymerization of the cationically-polymerizable monomer(s), nor does it activate the cationic polymerization catalyst (i.e., the organometallic complex salt or onium salt), which is thermally stable and photochemically labile. This ability to separate the two cures allows the adhesive systems of the invention to have very long shelf lives in the pressure-sensitive adhesive (PSA) state before application and use.

The pressure sensitive adhesive of this preferred embodiment of the present invention can be converted into a structural or semi-structural adhesive by: (a) applying sufficient irradiation to the curable PSA to activate the photo-activatable catalyst system, and (b) providing sufficient time and/or thermal energy to effect essentially complete polymerization of the cationically polymerizable monomer.

An additional advantage of this preferred embodiment of the present invention is provided by the lower thermal curing temperatures of the cationically cured polymerizable monomer(s) as opposed to the thermal cure temperatures required for cationically-cured monomer(s) of known systems. Typically, temperatures required to cure cationically-cured monomers such as epoxies can be so high as to preclude the use of certain low-melting or temperature-sensitive backings or substrates. In contrast, photo-activatable catalyst systems used in this preferred embodiment of the present invention are such that cationic cure to form liquid crystal display planarization (protective) coatings can occur at lower, unharmful temperatures.

Further, the presently preferred method of controlling the acrylate polymerization exotherm in a heat exchange medium allows complete temperature control over the pressure sensitive adhesive preparation step. Subsequent photo-activation and curing of the thermosetting resin component, that is, the epoxy component of the adhesive system increases the strength and hardness of the material to a level which cannot be achieved by traditional pressure sensitive adhesives.

Yet another advantage of the invention is achieved due to the ability to control room-temperature latency of the photopolymerization catalyst used in curing the thermosetting resin. Thus, reasonable working times after photolysis of the composition can be realized (for example, several hours), allowing for positioning (and repositioning) of the substrates to be adhered before a permanent bond is obtained. The low cure temperature of the thermosetting resin makes the adhesive of the present invention especially suitable for those applications where higher temperatures cannot be tolerated, due to equipment limitations or to the use of thermally sensitive substrates (e.g., thermoplastics), thermally sensitive color array pigments, etc.

In yet a further aspect of the present invention, curable pressure sensitive adhesives useful in the optical elements of the invention can be prepared according to the method comprising the steps:

(1) preparing a first polymerizable composition comprising a mixture of
 (a) at least one free-radically polymerizable monomer,
 (b) at least one free-radical initiator,
(2) applying sufficient energy to the mixture to effect essentially complete polymerization of the free-radically polymerizable monomer;
(3) mixing into the polymerized composition, a second polymerizable composition comprising a mixture of:
 (a) at least one cationically-polymerizable monomer,
 (b) a photo-activatable catalyst system for the cationically-polymerizable monomer comprising at least one organometallic complex salt or at least one onium salt, and
 (c) optionally, a monohydric or polyhydric alcohol.

Alternatively, the cationically-polymerizable monomer can be added to the first polymerizable composition, wherein the photo-activatable catalyst system for the cationically-polymerizable monomer is added after the first polymerizable composition has been polymerized.

The free-radically polymerized polymer may be prepared in any of a number means known in the art, such as photo-polymerization or thermal-polymerization, either of which can be carried out in the bulk (100% solids) or in solution. Preferably the free-radically polymerized polymer is prepared by thermal polymerization in the bulk with the cationically-polymerizable monomer present.

Advantageously, in contrast to known energy-curable epoxy-acrylate compositions, such as those described in U.S. Pat. No. 5,252,694 (col. 7, line 57 through col. 8, line 56), thermally decomposable esters are not required as accelerators/additives in the present formulations.

"Group" or "monomer" or "anion" or "ligand" means chemical species that allows for substitution or that may be substituted by conventional substituents that do not interfere with the desired product, for example, substituents can be alkyl, alkoxy, aryl, phenyl, halo (F, Cl, Br, 1), cyano, nitro, etc.;

Cationically-polymerizable monomers useful in the invention include but are not limited to epoxy-containing materials, alkyl vinyl ethers, cyclic ethers, styrene, divinyl benzene, vinyl toluene, N-vinyl compounds, cyanate esters, 1-alkenes (alpha olefins), lactams and cyclic acetals.

Cyclic ethers that can be polymerized in accordance with this invention include those described in Frisch and Reegan *Ring-Opening Polymerizations* Vol. 2 (1969). Suitable 1,2-cyclic ethers include monomeric and polymeric types of epoxides. Particularly suitable are the aliphatic, cycloaliphatic, and glycidyl ether type 1,2 epoxides. A wide variety of commercial epoxy resins are available and listed in Lee and Neville *Handbook of Epoxy Resins* I1967) and P. Bruins *Epoxy Resin Technology* (1968). Representative of 1,3- and 1,4-cyclic ethers that can be polymerized in accordance with this invention are oxetane, 3,3-bis(chloromethyl) oxetane, and tetrahydrofuran.

Additional cationically-polymerizable monomers are described in U.S. Pat. No. 5,252,694 at col. 4, line 30 through col. 5, line 34, the description of which is incorporated herein by reference. Preferred monomers of this class include EPON™828, and EPON™1001F and the ERL series of cycloaliphatic epoxy monomers such as ERL-4221™ or ERL-4206™; most preferred monomers are the ERL series because of their lower cure temperatures.

Free-radically polymerizable ethylenically-unsaturated monomers useful in the invention include but are not limited to (meth)acrylates and vinyl ester functionalized materials. The starting material can either be monomers or oligomers such be described in U.S. Pat. No. 5,252,694 at col. 5, lines 35–68.

Alternatively, useful monomers comprises at least one free-radically polymerizable functionality. Examples of such monomers include specifically, but not exclusively, the following classes:

Class A—acrylic acid esters of an alkyl alcohol (preferably a non-tertiary alcohol), the alcohol containing from 1 to 14 (preferably from 4 to 14) carbon atoms and include, for example, methyl acrylate, ethyl acrylate, n-butyl acrylate, t-butyl acrylate, hexyl acrylate, isooctyl acrylate, 2-ethylhexyl acrylate, isononyl acrylate, isobornyl acrylate, phenoxyethyl acrylate, decyl acrylate, and dodecyl acrylate;

Class B—methacrylic acid esters of an alkyl alcohol (preferably a non-tertiary alcohol), the alcohol containing from 1 to 14 (preferably from 4 to 14) carbon atoms and include, for example, methyl methacrylate, ethyl methacrylate, n-propyl methacrylate, n-butyl methacrylate, isobutyl metbacrylate and t-butyl methacrylate;

Class C—(meth)acrylic acid monoesters of polyhydroxy alkyl alcohols such as 1,2-ethanediol, 1,2-propanediol, 1,3-propane diol, the various butyl diols, the various hexanediols, glycerol, such that the resulting esters are referred to as hydroxyalkyl (meth)acrylates;

Class D—multifunctional (meth)acrylate esters, such as 1,4-butanediol diacrylate, 1,6-hexanediol diacrylate, glycerol diacrylate, glycerol triacrylate, and neopentyl glycol diacrylate although these monomers are generally not preferred for reactive extrusion or melt blending;

Class E—macromeric (meth)acrylates, such as (meth) acrylate-terminated styrene oligomers and (meth)acrylate-terminated polyethers, such as are described in PCT Patent Application WO 84/03837 and European Patent Application EP 140941;

Class F—(meth)acrylic acids and their salts with alkali metals, including, for example, lithium, sodium, and potassium, and their salts with alkaline earth metals, including, for example, magnesium, calcium, strontium, and barium.

Although cure temperatures of the cationically polymerizable monomers can be affected, it is within the scope of the present invention to also use a seventh class of free radically monomers, namely "Class G" monomers. Class G monomers include nitrogen-bearing monomers selected from the group consisting of (meth)acrylonitrile, (meth)acrylamide, N-substituted (meth)acrylamides, N,N-disubstituted (meth) acrylanides, the latter of which may include substituents of 5-and 6-membered heterocyclic rings comprising one or more heteroatoms, and methyl-substituted maleonitrile, and N-vinyl lactams, such as N-vinyl pyrrolidinone and N-vinyl caprolactam.

Two other criteria for the free-radical monomers are preferred, but not required: (a) these monomers should be miscible with the epoxy monomer(s) and (b) the free-radical monomers are preferably chosen such that their copolymers have composite Tgs in the range of 30° C. or less, as calculated by, e.g., the Fox equation, *Bull. Am. Phys. Soc.*, 1, 123 (1956).

Bifunctional monomers may also be used and examples that are useful in this invention possess at least one free radical and one cationically reactive functionality per monomer. Examples of such monomers include, but are not limited to glycidyl (meth)acrylate, hydroxyethyl (meth) acrylate, hydroxypropyl methacrylate and hydroxybutyl acrylate.

Suitable organometallic complex salts include those described in U.S. Pat. No. 5,059,701 and such description is incorporated herein by reference. In addition to those described in U.S. Pat. No. 5,059,701, the organometallic complex salts described in EPO No. 109,851 are also useful in the present invention. Useful organometallic complex salts used in the present invention have the following formula:

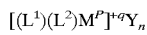

wherein $M^P$ represents a metal selected from the group consisting of: Cr, Mo, W, Mn, Re, Fe, and Co;

$L^1$ represents 1 or 2 ligands contributing pi-electrons that can be the same or different ligand selected from the group of substituted and unsubstituted $eta^3$-allyl, $eta^5$-cyclopentadienyl, and $eta^7$-cycloheptatrienyl, and $eta^6$-aromatic compounds selected from $eta^6$-benzene and substituted $eta^6$-benzene compounds and compounds having 2 to 4 fused rings, each capable of contributing 3 to 8 pi-electrons to the valence shell of $M^P$;

$L^2$ represents none, or 1 to 3 ligands contributing an even number of sigma-electrons that can be the same or different ligand selected from the group of: carbon monoxide, nitrosonium, triphenyl phosphine, triphenyl stibine and derivatives of phosphorus, arsenic and antimony, with the proviso that the total electronic charge contributed to MP results in a net residual positive charge of q to the complex;

q is an integer having a value of 1 or 2, the residual charge of the complex cation;

Y is a halogen-containing complex anion selected from $BF_4^-$, $AsF_6^-$, $PF_6^-$, $SbF_5OH^-$, $SbF_6^-$, and $CF_3SO_3^-$; and n is an integer having a value of 1 or 2, the number of complex anions required to neutralize the charge q on the complex cation.

Preferred organometallic initiators are the cyclopentadienyl iron arenes (CpFeArenes), and preferably, $SbF_6^-$ is the counterion. CpFe(arenes) are preferred because they are very thermally stable yet are excellent photoinitiation catalysts.

Useful cationic photoinitiators comprising onium salts have been described as having the structure AX wherein:

A is an organic cation selected from diazonium, iodonium, and sulfonium cations, more preferably A is selected from diphenyliodonium, triphenylsulfonium and phenylthiophenyl diphenylsulfonium; and X is an anion, the counterion of the onium salts including those in which X is organic sulfonate, or halogenated metal or metalloid.

Particularly useful onium salts include, but are not limited to, aryl diazonium salts, diaryl iodonium salts, and triaryl sulfonium salts. Additional examples of the onium salts are described in U.S. Pat. No. 5,086,086, col. 4, lines 29–61, and such description is incorporated herein by reference.

Cationic photoinitiators that are also useful include aromatic iodonium complex salts and aromatic sulfonium complex salts. These photosensitive salts are well known in the literature, as for example, in U.S. Pat. Nos. 4,156,046 and 4,587,169.

Of the aromatic sulfonium complex salts that are suitable for use in the present invention, the preferred salts are triaryl-substituted salts such as triphenylsulfonium hexafluorophosphate and triphenylsulfonium hexafluoroantinomate. The triaryl substituted salts are preferred because they are more thermally stable than the mono- and diaryl substituted salts.

Thermal free radical initiators useful in the present invention include, but are not limited to azo, peroxide, persulfate, and redox initiators.

Suitable azo initiators include, but are not limited to 2,2'-azobis(4-methoxy-2,4-dimethlvaleronitrile) (VAZO™ 33), 2,2'-azobis(amidinopropane) dihydrochloride (VAZO™ 50); 2,2'-azobis(2,4-dimethylvaleronitrile) (VAZO™ 52); 2,2'-azobis(isobutrynitrile) (VAZ) ™ 64); 2,2'-azobis-2-methylbutyronitrile (VAZO™ 67); 1,1'-azobis (1-cyclohexadecanecarbonitrile) (VAZO™ 88), all of which are available from DuPont Chemicals and 2,2'-azobis (methyl isobutyrate) (V-601) available from Wako Chemicals.

Suitable peroxide initiators include, but are not limited to, benzoyl peroxide, acetyl peroxide, lauroyl peroxide, decanoyl peroxide, dicetyl peroxydicarbonate, di(4-t-butylcyclohexyl) peroxydicarbonate (PERKADOX™16S, available from AKZO Chemicals), di(2-ethylhexyl) peroxydicarbonate, t-butylperoxypivalate (Lupersol™11, available from Atochem), t-butylperoxy-2-ethylhexanoate (Trigonox™ 21-C50, available from Akzo Chemicals, Inc.), and dicumyl peroxide.

Suitable persulfate initiators include, but are not limited to, potassium persulfate, sodium persulfate, and ammonium persulfate.

Suitable redox (oxidation-reduction) initiators include, but are not limited to, combinations of the above persulfate initiators with reducing agents such as sodium metabisulfite and sodium bisulfite; systems based on organic peroxides and tertiary amines, for example, benzoyl peroxide plus dimethylaniline; and systems based on organic hydroperoxides and transition metals, for example, cumene hydroperoxide plus cobalt naphthenate.

Other initiators include, but are not limited to pinacols, such as tetraphenyl 1,1,2,2-ethanediol.

Preferred thermal free-radical initiators are selected from the group consisting of peroxides and azo compounds that do not contain nitriles or basic groups. Most preferred initiators are V-601, Lupersol™11 and Perkadox™ 16S, and mixtures thereof, because of their preferred decomposition temperature is in the range of about 45 to 95° C. Additionally, they are generally inert toward cationic polymerization initiators.

The initiator is present in a catalytically-effective amount and such amounts are typically in the range of about 0.01 parts to 5 parts, and more preferably in the range from about 0.025 to 2 parts by weight, based upon 100 total parts by weight of monomer or monomer mixture. If a mixture of initiators is used, the total amount of the mixture of initiators would be as if a single initiator was used.

Photoinitiators that are useful for partially polymerizing alkyl acrylate monomer without crosslinlling, to prepare syrups, include the benzoin ethers, such as benzoin methyl ether or benzoin isopropyl ether, substituted benzoin ethers, such as anisoin methyl ether, substituted acetophenones, such as 2,2-diethoxyacetophenone and 2,2-dimethoxy-2-phenylacetophenone, substituted alpha-ketols, such as 2-methyl-2-hydroxypropiophenone, aromatic sulfonyl chlorides, such as 2-naphthalene-sulfonyl chloride, and photoactive oximes, such as 1-phenyl-1,2-propanedione-2(O-ethoxycarbonyl)oxime. They may be used in amounts, which as dissolved provide about 0.001 to 0.5 percent by weight of the alkyl acrylate monomer, preferably at least 0.01 percent.

Optionally, monohydroxy- and polyhydroxy-alcohols may be added to the curable compositions of the invention, as chain-extenders for the epoxy resin. Suitable examples of alcohols include but are not limited to methanol, ethanol, 1-propanol, 2-propanol, 1-butanol, 1-pentanol, 1-hexanol, 1-heptanol, 1-octanol, pentaerythritol, 1,2-propanediol, ethylene glycol, 1,4-butanediol, 1,5-pentanediol, 1,6-hexanediol, 1,4-cyclohexane dimethanol, 1,4-cyclohexanediol and glycerol.

Preferably, compounds containing hydroxyl groups, particularly compounds containing from about 2 to 50 hydroxyl groups and above all, compounds having a weight average molecular weight of from about 50 to 25,000, preferably from about 50 to 2,000, for example, polyesters, polyethers, polythioethers, polyacetals, polycarbonates, poly(meth) acrylates, and polyester amides, containing at least 2, generally from about 2 to 8, but preferably from about 2 to 4 hydroxyl groups, or even hydroxyl-containing prepolymers of these compounds, are representatives compounds useful in accordance with the present invention and are described, for example, in Saunders, *High Polymers, Vol. XVI*, "Polyurethanes, Chemistry and Technology," Vol. I, pages 32–42, 44–54 and Vol. II, pages 5–6, 198–99 (1962, 1964), and in Kunststoff-Handbuch, Vol. VII, pages 45–71 (1966). It is, of course, permissible to use mixtures of the above-mentioned compounds containing at least two hydroxyl groups and having a molecular weight of from about 50 to 50,000 for example, mixtures of polyethers and polyesters.

In some cases, it is particularly advantageous to combine low- melting and high-melting polyhydroxyl containing compounds with one another (German Offenlegungsschrift No. 2,706,297).

Low molecular weight compounds containing at least two reactive hydroxyl groups (molecular weight from about 50 to 400) suitable for use in accordance with the present invention are compounds preferably containing hydroxyl groups and generally containing from about 2 to 8, preferably from about 2 to 4 reactive hydroxyl groups. It is also possible to use mixtures of different compounds containing at least two hydroxyl groups and having a molecular weight in the range of from about 50 to 400. Examples of such compounds are ethylene glycol, 1,2- and 1,3-propylene glycol, 1,4- and 2,3-butylene glycol, 1,5-pentanediol, 1,6-hexanediol, 1,8-octanediol, neopentyl glycol, 1,4-cyclohexane dimethanol, 1,4-cyclohexanediol, trimethylolpropane, 1,4-bis-hydroxymethyl cyclohexane, 2-methyl-1,3-propanediol, dibromobutenediol (U.S. Pat. No. 3,723,392), glycerol, trimethylolpropane, 1,2,6-hexanetriol, trimethylolethane, pentaerythritol, quinitol, mannitol, sorbitol, diethylene glycol, triethylene glycol, tetraethylene glycol, higher polyethylene glycols, dipropylene glycol, higher polypropylene glycols, dibutylene glycol, higher polybutylene glycols, 4,4'-dihydroxy diphenyl propane and dihydroxy methyl hydroquinone.

Other polyols suitable for the purposes of the present invention are the mixtures of hydroxy aldehydes and hydroxy ketones ("formose") or the polyhydric alcohols obtained therefrom by reduction ("formitol") which are formed in the autocondensation of formaldehyde hydrate in the presence of metal compounds as catalysts and compounds capable of enediol formation as co-catalysts (German Offenlegungsschrift Nos. 2,639,084, 2,714,084, 2,714,104, 2,721,186, 2,738,154 and 2,738,512).

It is contemplated that polyfunctional alcohols such as carbowaxes poly(ethylene glycol), poly(ethylene glycol methyl ether), poly(ethylene glycol) tetrahydrofurfuryl ether, poly(propylene glycol) may also be used in the compositions of the present invention.

It is also within the scope of this invention to add optional adjuvants provided they are not detrimental to the cationic cure and/or function of the liquid crystal display element and include, for example, thixotropic agents; plasticizers; toughening agents such as those taught in U.S. Pat. No. 4,846,905; stabilizers, light stabilizers, antioxidants, flow agents, bodying agents, flatting agents, binders, fungicides, bactericides, surfactants; and other additives as known to those skilled in the art can be added to the compositions of this invention. These can be added in an amount effective for their intended purpose; typically, amounts up to about 25 parts of adjuvant per total weight of formulation can be used. The additives can modify the properties of the basic composition to obtain a desired effect.

Furthermore, the additives can be reactive components such as materials containing reactive hydroxyl functionality. Alternatively, the additives can be also substantially unreactive, such as fillers, including both inorganic and organic fillers.

Optionally, it is within the scope of this invention to include photosensitizers or photoaccelerators in the radiation-sensitive compositions. Use of photosensitizers or photoaccelerators alters the wavelength sensitivity of radiation-sensitive compositions employing the latent catalysts of this invention. This is particularly advantageous when the latent catalyst does not strongly absorb the incident radiation. Use of a photosensitizer or photoaccelerator increases the radiation sensitivity allowing shorter exposure times and/or use of less powerful sources of radiation. Any photosensitizer or photoaccelerator may be useful if its triplet energy is at least 45 kilocalories per mole. Examples of such photosensitizers are given in Table 2-1 of the reference, S. L. Murov, *Handbook of Photochemistry*, Marcel Dekker Inc., N.Y., 27–35 (1973), and include pyrene, fluoranthrene, xanthone, thioxanthone, benzophenone, acetophenone, benzil, benzoin and ethers of benzoin, chrysene, p-terphenyl, acenaphthene, naphthalene, phenanthrene, biphenyl, substituted derivatives of the preceding compounds, and the like. When present, the amount of photosensitizer or photoaccelerator used in the practice of the present invention is generally in the range of 0.01 to 10 parts, and preferably 0.1 to 1.0 parts, by weight of photosensitizer or photoaccelerator per part of organometallic salt or onium salt.

Other materials that can be blended with the polymerizable compositions of this invention include tackifiers, reinforcing agents, and other modifiers, some of which may copolymerize with the free radically or cationically polymerizable monomers or photopolymerize independently. However, the addition of any such material adds complexity and hence expense to an otherwise simple, straightforward, economical process and is not preferred except to achieve specific results.

While it is preferred that solvents are not used in preparing the polymerizable compositions of the present invention, solvents, preferably organic, can be used to assist in dissolution of the catalyst system in the free radically and cationically polymerizable monomers. It may be advantageous to prepare a concentrated solution of the organometallic complex salt or the onium salt in a solvent to simplify the preparation of the polymerizable composition. Representative solvents include acetone, methyl-ethyl-ketone, cyclopentanone, methyl cellosolve acetate, methylene chloride, nitromethane, methyl formate, gamma-butyrolactone, propylene carbonate, and 1,2-dimethoxyethane (glyme).

Irradiation sources that provide light in the region from 200 to 800 nm are effective in the practice of this invention. A preferred region is between 250 to 700 nm. Suitable sources of radiation include mercury vapor discharge lamps, carbon arcs, quartz halogen lamps, tungsten lamps, xenon lamps, fluorescent lamps, lasers, sunlight, etc. The required amount of exposure to effect polymerization is dependent upon such factors as the identity and concentrations of the photo-activatable catalyst system, the particular free radically and cationically polymerizable monomers, the thickness of the exposed material, type of substrate, intensity of the radiation source and amount of heat associated with the radiation.

Preferred compositions of the invention comprise monomer ratios of 10–70, preferably 20–50% epoxy monomer(s) and 30–90%, preferably 50–80% acrylate monomer(s).

The curable adhesive composition can be prepared using a free radically polymerizable syrup (also referred to as "syrup"), that is partially polymerized free radical monomers (1% to 30% conversion), or a mixture of partially polymerized free radical monomers and substantially unpolymerized epoxy monomers, and optional adjuvants.

Irradiation of the photocurable composition may be effected by any radiation source which emits wavelengths which can induce the crosslinking/polymerization of the photocurable layer. Lasers, broad spectrum emitters (banks of UV lamps), light emitting diodes, flash lamps, and any other useful radiation source may be used. The compositions may be exposed to radiation to which they are natively sensitive (usually UV radiation) or may be spectrally sensitized as is well understood in the art by the addition of spectral sensitizing dyes. In this manner, it is particularly desirable to spectrally sensitize the photocurable composition to wavelengths outside the visible spectrum so that coloration is not added to the optical element. The use of UV or infrared radiation spectral sensitizers can easily effect this result. The use of spectral sensitizers which provide less than 0.3 optical density for the curable layers of the invention at a thickness between 0.5 and 50 micrometers within the visible range of the electromagnetic spectrum is particularly desirable.

The liquid photocurable coating compositions may be applied by any conventional liquid application method, including but not limited to gravure coating, curtain coating, slot coating, spin coating, screen coating, brush or roller coating, and the like. The thickness of the layer is in part dependent upon the nature of the materials used and the specific properties desired in the layers, but those properties and the relationship of thickness to the properties is well understood in the art. The temporary substrate may be of any dimension, the conductive layer may range, for example, from 0.05 or 0.1 to 100 micrometers, the photocurable layer may range from 0.05 to 100 micrometers. One of the benefits of the photocurable layer is that it can function as an alignment layer or planarization layer (as the layer is alternatively described in the art) with respect to other layers or elements which are adjacent to the optical element.

EXAMPLES

Pref waration of Adhesive/Film/Electrode(Alii (ment Layer) Elements

A. Elements Incorporating Conventional (Non-curing) Pressure Sensitive Adhesives 1. Copolyester of 9,9-bis-(4-hydroxyphenyl)-fluorene/ITO, 102944-52

Indium tin oxide (hereafter referred to as "ITO") was sputtered onto 2 mil film comprised of copolyesters based upon reaction of 9,9-bis-(4-hydroxyphenyl)-fluorene with terephthalic and isophthalic acid (hereafter referred to as "FPE"). This sample is designated "102944-52." The conductivity of this coating in a continuous region was determined to be ca. 80 ohms/square. The thickness of the ITO coating was determined be 3300Å by profilometry after masking and etching with 10% aqueous HCl.

2. Amorphous Polyolefin/ITO/Ag/ITO/SiO2/Polyimide, 102944-97

The following layers were successively sputtered (in the order listed) onto a 5 mil amorphous polyolefin film: 1) ITO (ca. 350 Å); 2) Ag (ca. 100 Å); 3) ITO (ca. 350 Å); 4) $SiO_2$ (ca. 2000 Å). The $SiO_2$ coating surface was subsequently overcoated with a solution of Nissan Chemical SE5211 (preimidized polyimaide) to provide, after drying, a 200–300 Å alignment layer on the multilayer electrode construction. This sample is designated "102944-97."

3. Reichold 40440 Adhesive/102944-52 Element

The polyester surface of 102944-52 was coated with a aqueous emulsion of Reichold 40440 adhesive (35 weight percent nonvolatiles) utilizing a #12 coating rod. The coated element was then dried for 2 minutes at 180° F. in an oven.

4. Reichold 40440 Adhesive/102944-97 Element

The polyolefin surface of 102944-97 was coated with a aqueous emulsion of Reichold 40440 adhesive (35 weight percent nonvolatiles) utilizing a #12 coating rod. The coated element was then dried for 2 minutes at 180° F. in an oven.

B. Elements Incorporating Curable Pressure Sensitive Adhesives

1. Amorphous Polyolefin/ITO/Ag/ITO, 103616-96

The following layers were successively sputtered (in the order listed) onto a 5 mil amorphous polyolefin film: 1) ITO (ca. 350 Å); 2) Ag (ca. 100 Å); 3) ITO (ca 350 Å). This sample is designated "103616-96."

2. Amorphous Polyolefin/ITO, 103616-97

Approximately 700 Å ITO was sputtered onto a 5 mil amorphous polyolefin film. This sample is designated "103616-97."

3. Preparation of Curable PSA Transfer Tape 104814-52

A mixture comprised of 33.75 weight % of a solution of 70/30 methyl acrylate/n-butyl acrylate copolymer (intrinsic viscosity=0.49, 52.8 weight % nonvolatiles in 89/11 ethyl acetate/2-propanol), 14.25 weight % Epon 828 (Shell), 2.85 weight % of xylene cycopentadienyliron (II) hexafluoroantimonate (5.00 weight % nonvolatiles in 80/20 ethyl acetate/2- butanone), 0.14 weight % amyl oxalate and 49.00 weight % of a 80/20 mixture of ethyl acetate/2-butanone was prepared. This mixture was then knife-coated at 0.4 mm onto a siliconized polyester liner (3M 11-0011-3264-3) and dried by exposing the coated samples to three, consecutive 5 minute periods at 25° C., 60° C., and 80° C., respectively. The dried transfer tapes were then covered with a premium release paper liner (3M 7002), hand-slit to samples ca. 19 mm×64 mm. and stored in the dark. The resultant samples are designated "104814-52."

4. Preparation of Curable PSA Transfer Tape 103551-79

A mixture of 30 weight % phenoxyethyl acrylate (CPS Chemicals of Arkansas), 30 weight % isobornyl acrylate (Sartomer), 40 weight % ERL-4206 epoxy resin (Union Carbide) and 0.02 weight % KB-1 photoinitiator (Sartomer) was prepared, purged with $N_2$ and irradiated with Sylvania #F15T8/350BL fluorescent bulbs with stirring until the viscosity of the mixture reached ca. 1000 cps (700 kcPa).

A mixture comprised of 98.18 weight % of the above syrup, 0.39 weight % pulverized xylene cycopentadienyliron (II) hexafluoroantimonate, 0.79 weight % 2-butanone, 0.39 weight % hexanediol diacrylate, 0.10 weight % V-601 initiator (Wako Chemical) and 0.15 weight % Perkadox 16 (Akzo Chemical) was prepared and degassed. This mixture was then knife-coated at 0.05 mm between two siliconized polyester liners (Courtland 30/1897-2-5, AZ805 3/1/93) under subdued lighting. The resultant coatings were then heated by placing them for 10 minutes between two aluminum plates which were preheated to 85° C. The samples were then heated for a second time by placing them for 15 minutes between two aluminum plates which were preheated to 100° C. The resultant coatings were then hand-slit to samples ca 19 mm×64 mm. and stored in the dark. The resultant samples are designated "103551-79."

5. Preparation of Adhesion Primed Amorphous Polyolerin/ITO/Ag/ITO, 103551-76A

Onto the non-ITO coated side of 103616-96 was coated 3M adhesion primer "7C1894" with a #20 coating rod and dried in an 85° C. oven for 10 minutes. This material was then hand-slit to samples ca. 25 mm×75 mm. The resultant samples are designated "103551-76A."

6. Preparation of Adhesion Primed Amorphous Polyolefin/ITO, 103551-76B

On to the non-electrode coated side of 103616-97 was coated 3M adhesion primer "7Cl894" with a #20 coating rod and dried in an 85° C. oven for 10 minutes. This material was then hand-slit to samples ca. 25 mm×75 mm. The resultant samples are designated "103551-76B."

7. Preparation of Release Liner/104814-52 Curable PSA/ Adhesion Primed Amorphous Polyolefin/ITO/Ag/ITO Element, 104814-53A A sample of 103551-76A was positioned with the adhesion primed amorphous polyolefin side facing up. The premium release paper liner was then removed from a sample of 104814-52 curable PSA transfer tape and the exposed PSA is then aligned coextensive and in contact with the adhesion primed surface of 103551-76A. The resulting sample was then placed in a Pressure Sensitive Tape Council Rolldown Machine transversed at ambient temperature, once in the forward direction and once in the reverse direction, with 4.5 lb. rolls at 12 inches/minute. The Pressure Sensitive Tape Council Rolldown Machine is manufactured to meet ASTM, PSTC, TLMI, FINAT and AFERA standards. The resultant laminated sample is designated "104814-53A."

8. Preparation of Release Liner/104814-52 Curable PSA/ Adhesion Primed Amorphous Polyolerin/ITO/ Element, 104814-53B A sample of 103551-76B was positioned with the adhesion primed amorphous polyolefin side facing up. The premium release paper liner was then removed from a sample of 104814-52 curable PSA transfer tape and the exposed PSA is then aligned coextensive and in contact with the adhesion primed surface of 103551-76B. The resulting sample was then placed in a Pressure Sensitive Tape Council Rolldown Machine and transversed at ambient temperature, once in the forward direction and once in the reverse direction, with 4.5 lb. rolls at 12 inches/minute. The resultant laminated sample is designated "104814-53B."

9. Preparation of Release Liner/103551-79 Curable PSA/ Adhesion Primed Amorphous Polyolefin/ITO/Ag/ITO Element, 104814-57A A sample of 103551-76A was positioned with the adhesion primed amorphous polyolefin side facing up. One PET release liner was then removed from a sample of 103551-79 curable PSA transfer tape and the exposed PSA is then aligned coextensive and in contact with the adhesion primed surface of 103551-76A. The resulting sample was then placed in a Pressure Sensitive Tape Council Rolldown Machine and transversed at ambient temperature, once in the forward direction and once in the reverse direction, with 4.5 lb. rolls at 12 inches/minute. The resultant laminated sample is designated "104814-57A."

10. Preparation of Release Liner/103551-79 Curable PSA/Adhesion Primed Amorphous Polyolefin/ITO/ Element, 104814-57B A sample of 103551-76B was positioned with the adhesion primed amorphous polyolefin side facing up. One PET release liner was then removed from a sample of 103551-79 curable PSA transfer tape and the exposed PSA is then aligned coextensive and in contact with the adhesion primed surface of 103551-76B. The resulting sample was then placed in a Pressure Sensitive Tape Council Rolldown Machine and transversed at ambient temperature, once in the forward direction and once in the reverse direction, with 4.5 lb. rolls at 12 inches/minute. The resultant laminated sample is designated "104814-57B."

Pretaration of Film/Electrode/Curable Adhesive Elements for Electrode/Protection Laver Transfer A. Preparation of Transparent Electrode (ITO) Transfer Film, 104814-64C Approximately 700Å ITO was sputtered onto the fluorosilicone-coated side of a 2 mil poly(ethylene terephthalate) Dow Corning "FL-2000 DP6301"release liner. This material was then hand-slit to samples ca. 25 mm×75 mm. The resultant samples are designated "104814-64C."

B. Preparation of Film/Electrode/Curable Adhesive Element for Electrode/Protection Layer Transfer, 104814-65A A sample of 104814-64C was positioned with the ITO surface facing up. The premium release paper liner was then removed from a sample of 104814-52 curable PSA transfer tape and the exposed PSA is then aligned coextensive and in contact with the ITO surface of 104814-64C. The resulting sample was then placed in a Pressure Sensitive Tape Council Rolldown Machine and transversed at ambient temperature, once in the forward direction and once in the reverse direction, with 4.5 lb. rolls at 12 inches/minute. The resultant laminated sample is designated "104814-65A."

Preparation of Substrate/(Black Matrix)/Color Cell Arrav Elements

A. Light-to-Heat Conversion Black Aluminum Layer/4 Mil PET Substrate

A black aluminum (AlOe) coating was deposited onto 4 mil poly(ethylene terephthatate) (hereafter referred to as "PET") substrate via sputtering of Al in an $Ar/O^2$ atmosphere according to the conditions provided in Table 1. This sample is designated "BR 93285." The transmission and reflection spectra of BR 93285 were measured from both the $AlO_x$-coating and substrate (PET) sides using a Shimadzu MPC-3100 spectrophotometer with an integrating sphere. The transmission optical densities (TOD=−logT, where T is the measured fractional transmission) and reflection optical densities (ROD=logR where R is the measured fractional reflectance) at 1060 nm are listed in Table 1. The thickness of the black aluminum coating was determined by profilometry after masking and etching a portion of the coating with 20 percent by weight aqueous sodium hydroxide.

TABLE 1

Sputtering Voltage = 446 volts
Vacuum System Pressure = 5.0 × 10$^{-3}$ torr
O$_2$/Ar Flow Ratio = 0.02
Substrate Transport Speed = 3.5 ft./min.

| Sample Designation | Side of Incident Beam | TOD at 1060 nm | ROD at 1060 nm | Thickness, Å |
|---|---|---|---|---|
| BR 93285 | Coating | 0.771 | 0.389 | 535 |
| BR 93285 | Substrate | 0.776 | 0.522 | 535 |

B. Preparation of Blue Donor 102944-80-1

1. Microlith Blue 4G-WA Pigment Dispersion 39.6 g Ciba-Geigy Microlith Blue, 66.0 g H$_2$O and 26.4 g 2-propanol were combined and mixed on a Silverson mixer for 2 minutes at 0.25 maximum speed. To this mixture was then added 8.8 g triethanolamine and the resultant mixture was mixed at 0.5 0 maximum speed for 20 minutes. An additional 22.0 g H$_2$O and 8.8 g 2-propanol were then added to the mixture and the resulting mixture was mixed for an additional 5 minutes at 0.50 maximum speed.

2. Microlith Violet RL-WA Pigment Dispersion

This dispersion was prepared as described above for the Microlith Blue 4G-WA Pigment Dispersion except the Ciba-Geigy Microlith Blue pigment was replaced with Microlith Violet RL-WA pigment.

3. Preparation of Energetic Polymer Binder Solution 2.0 g Acetylenedicarboxylic acid dissolved in 20 ml 2-butanone was added to 18.0 g poly(bis-(azidomethyl) oxitane (25% by weight in 2-butanone, Aerojet Corp.) maintained at 60° C. After maintaining the resultant mixture at 60° C. for 4 hours, the resultant mixture was cooled to ambient temperature. The nonvolatile components of this mixture were then isolated via removal of the volatile components under vacuum. The resultant nonvolatile components were then combined with 60 ml of 2-propanol/H$_2$O (1 volume: 2 volume) solution and 2.44 g ethanolamine (Aldrich). The nonvolatiles content of this mixture was then determined and adjusted to 5 weight percent via addition of a 2-propanol/H$_2$O (1 volume: 8 volume). This material is designated "100154-53."

4. Preparation of Blue Donor Coating Binder Solution 0.90 g H$_2$O, 0.15 g of a 5 weight percent solution of 3M FC-170C in 2-propanol/H$_2$O (1 volume: 1 volume), 13.0 g 100154-53 and 2.0 g B. F. Goodrich Hycar 26106 were combined and mixed. The resultant material is designated "102296-51(L11)."

5. Preparation of Blue Donor Coating Solution 3.0 g 102296-51(L11), 0.80 g Microlith Blue 4G-WA pigment dispersion (from above), 0.30 g Microlith Violet RL-WA pigment dispersion (from above) and 1.0 g H$_2$O were combined. Place the resultant mixture on a shaker table and mix for 10 minutes immediately prior to coating. This materials is designated "102296-51 (L17)."

6. Coating of Blue Donor 102944-80-1

102296-51 (L17) was coated onto the black aluminum coating of a sample of BR 93285 using a #4 coating rod. The resultant blue donor media was dried at 60° C. for 2 minutes to produce "102944-80-1."

C. Preparation of Cyan Donor 102944-70-1

1 Preparation of Cyan Donor Coating Solution 0.90 g Microlith Blue 4G-WA pigment dispersion (from above), 0.08 g of a 5 weight percent solution of 3M FC-170C in 2-propanol/H$_2$O (1 volume: 1 volume), 2.68 g of a 2-propanol/H$_2$O (1 volume: 8 volume) solution, 0.20 g Air Products and Chemicals Vancryl 600 and 0.20 g H$_2$O were combined. The resultant mixture was placed on a shaker table and mixed for 10 minutes immediately prior to coating. The obtained material is designated "102296-56 (L4)."

2. Coating of Cyan Donor 102944-70-1

102296-56(L4) was coated onto the black aluminum coating of a sample of BR 93285 using a #4 coating rod. The resultant blue donor media was dried at 60° C. for 2 minutes to produce "102944-70-1."

D. Preparation of Cyan Donor 102944-106A

1. Preparation of Polyurethane 96692-56A 47.6 g HUls Dynacol A7250 diol, 50 g 2-butanone, 16.0 g Mobay Desmodur W and 3 drops dibutyltin dilaurate were added in the order listed to a reaction vessel and mixed at ambient temperature. After ca. 0.5 hour, 2.1 g 1-glycerol methacrylate was added to the reaction mixture and the reaction was allowed to react for an additional hour at ambient temperature. 4.62 g Neopentyl glycol and an additional 15 g 2-butanone were then added to the reaction mixture and the reaction mixture was allowed to react for 4 days at ambient temperature. At the end of the 4 day reaction period an infrared spectrum of the mixture indicated that all the isocyanate functionality had reacted. This material is designated "96692-56A."

2. Microlith Blue 4G-WA Pigment/96692-56A Dispersion 7.92 g Microlith Blue 4G-WA pigment and 32.7 g 2-butanone were combined with stirring. This mixture was then agitated on a Silverson high shear mixer at 0.25 maximum speed for 20 minutes. To this mixture was then added 1.32 g BYK Chemie Disperbyk 161 in 5.0 g 2-butanone and the resultant mixture was mixed at 0.50 maximum speed for an additional 10 minutes. 19.80 g of 96692-56A was then added and the resultant mixture was agitated at 0.50 maximum speed for an additional 20 minutes.

3. Preparation of Cyan Coating Solution 102296-63A

To 1.80 g of the above Microlith Blue 4G-WA pigment/96692-56A dispersion were added 6.24 g 2-butanone and 12 drops of a 5 weight percent solution of 3M FC-170C in 2-butanone. The resultant mixture was placed on a shaker table and mixed for 10 minutes immediately prior to coating. The obtained material is designated "102296-63A."

4. Coating of Cyan Donor 102944-106A 102296-63A was coated onto the black aluminum coating of a sample of BR 93285 using a #4 coating rod. The resultant cyan donor media was dried at 60° C. for 2 minutes to produce "102944-106A."

E. Preparation of Cyan Donor 102944-106B

1. Preparation of Polyurethane 96692-56B

To 96692-56A prepared as described above was added 2 percent by weight (based upon the nonvolatile content of 96692-56A) Ciba-Geigy Irgacure 651. This material is designated "96692-56B."

2. Microlith Blue 4G-WA Pigment/96692-56B Dispersion

This material was prepared in a manner identical to that indicated above for the Microlith Blue 4G-WA pigment/96692-56A dispersion except that 96692-56B was substituted for 96692-56A.

3. Preparation of Cyan Coating Solution 102296-63B

This material was prepared in a manner identical to that indicated above for the cyan coating solution 102296-63A except that 4G-WA pigment/96692-56B dispersion was substituted for the Microlith Blue 4G-WA pigment/96692-56A dispersion. The obtained material is designated "102296-63B."

4. Coating of Cyan Donor 102944-106B 102296-63B was coated onto the black aluminum coating of a sample of BR 93285 using a #4 coating rod. The resultant cyan donor media was dried at 60° C. for 2 minutes to produce "102944-106B."

F. Preparation of Cyan Donor 103616-6B

Cyan donor 102944-106A was irradiated from the cyan coating side with a 10 Mrad dose (125 Kev electrons, $N_2$ inerting) using an ESI Electrocurtain electron beam accelerator. The resultant material is designated "103616-6B."

G. Preparation of Cyan Donor 103616-6C

Cyan donor 102944-106B was irradiated from the cyan coating side with a 5 Mrad dose (125 Kev electrons, $N_2$ inerting) using an ESI Electrocurtain electron beam accelerator. The resultant material is designated "103616-6C."

H. Preparation of Cyan Donor 103616-16B

Cyan donor 102944-106B was irradiated with 800 mJ/cm$^2$ from the cyan coating side under N2 inerting using an RPC Equipment UV Processor Model QC1202 (medium pressure Hg lamps). The resultant material is designated "103616-16B."

I. Preparation of Green Donor 104009-27E3

To a rapidly stirred 10.0 g sample of Heubach Aquis-II GW-3450 phthalo green (PG-7) is slowly added 40.0 g of deionized $H_2O$. 12.0 g of this solution is then combined with 4.5 grams of 50 weight % aqueous solution of Zeneca Resin BT-26, 6.0 g deionized $H_2O$ and 0.5 g of a 5 weight % solution of FC-170C in 2-propanol/$H_2O$ (1 volume: 1 volume). The resultant mixture is then placed on a shaker table, mixed for ten minutes and then coated onto the black aluminum coating of a sample of BR 93285 using a #4 coating rod. The resultant green donor media was dried at 60° C. for 2 minutes to produce "104009-27E3."

J. Preparation of an LCD Black Matrix on 4 mil PET

A sample of BR 93285 was imaged to produce a black matrix with an approximate cell size of 400 microns×60 microns and a matrix linewidth of 35 microns using an internal drum laser with the laser incident upon the black aluminum coating of the sample. The laser utilized was a Nd:YAG laser, lasing in the TEM00 mode, at 1064 nm. The power at the image plane was 3.2W, and the linear speed of the imaging laser spot was 128 m/s. The laser spot size was ca. 25 microns. The BR 93285 sample was held in place with a vacuum, with the media translated in a direction perpendicular to the direction of laser scan.

K. Preparation of PET Substrate/Black Matrix/Cyan Color Cell Array Element, 102944-71-1BM Without removing the imaged sample of the LCD black matrix on 4 mil PET from the internal drum laser, the cyan coating of a sample of donor 102944-70-1 was placed in contact with the black matrix. The sample was then imaged with the beam incident upon the substrate (PET) side of the cyan donor to transfer a cyan LCD color cell array onto the corresponding black matrix. The laser utilized was a Nd:YAG laser, lasing in the TEM00 mode, at 1064 nm. The power at the image plane was 3.2 watts, and the linear speed of the imaging laser spot was 128 m/s. The laser spot size was ca. 25 microns. The PET substrate/black matrix and cyan donor samples were held in place with a vacuum, with the media translated in a direction perpendicular to the direction of laser scan. The resultant PET substrate/black matrix/cyan color cell array elements prepared in this manner are designated "102944-71-1BM."

L. Preparation of PET Substrate/Black Matrix/Blue Color Cell Array Element, 102944-81-1BM Without removing the imaged sample of the LCD black matrix on 4 mil PET from the internal drum laser, the blue coating of a sample of donor 102944-80-1 was placed in contact with the black matrix. The sample was then imaged with the beam incident upon the substrate (PET) side of the blue donor to transfer a blue LCD color cell array onto the corresponding black matrix. The laser utilized was a Nd:YAG laser, lasing in the TEM00 mode, at 1064 nm. The power at the image plane was 3.2 watts, and the linear speed of the imaging laser spot was 128 m/s. The laser spot size was ca. 25 microns. The PET substrate/black matrix and blue donor samples were held in place with a vacuum, with the media translated in a direction perpendicular to the direction of laser scan. The resultant PET substrate/black matrix/blue color cell array elements prepared in this manner are designated "102944-81-ABM."

M. Preparation of Glass Substrate/Color Cell Array Elements

Glass substrate/color cell array elements were prepared according to Table 2 via laser induced transfer of the color cell array (lines parallel to the maximum dimension of the glass substrate) from the corresponding colorant donor to 75 mm×25 mm×1 mm glass substrates. The donor samples were imaged using a flat-field laser system. The laser utilized was a Nd:YAG laser, lasing in the TEM00 mode, at 1064 nm. The power at the image plane and the linear speed of the imaging laser spot utilized for preparation of each of these corresponding LCD color cell array elements are provided in Table 2. The laser spot size in each case was ca. 80 microns. The donor and glass receptor were held in place with a vacuum, with the media translated in a direction perpendicular to the direction of laser scan. The laser was scanned using a linear Galvonometer (General Scanning Model M3-H).

TABLE 2

| Donor Sample | Laser Power at Image Plane, watts | Linear Speed of Imaging Laser Spot, m/s | Designation of Resultant Glass Substrate/Colors Cell Array Element |
|---|---|---|---|
| 102944-80-1 | 7.0 | 6.2 | 102944-81-1G |
| 102944-70-1 | 7.2 | 6.2 | 102944-71-1G |
| 102944-106A | 7.0 | 3.6 | 102944-106A(Glass) |
| 102944-106B | 7.0 | 3.6 | 102944-106B(Glass) |
| 103616-6B | 6.0 | 3.6 | 103616-18C |
| 103616-6C | 6.0 | 3.6 | 103616-18D |
| 103616-16B | 6.0 | 3.6 | 103616-18G |

N. Preparation of Glass Substrate/Color Cell Array Element 103616-6E

Glass substrate/color cell array element 102944-106A (Glass) was irradiated from the color cell array side with a 5 Mrad dose (125 Kev electrons, $N_2$ inerting) using an ESI Electrocurtain electron beam accelerator. The resultant glass substrate/color cell array element is designated "103616-6E."

O. Preparation of Glass Substrate/Color Cell Array Element 103616-6G

Glass substrate/color cell array element 102944-106B (Glass) was irradiated from the color cell array side with a 5 Mrad dose (125 Kev electrons, $N_2$ inerting) using an ESI Electrocurtain electron beam accelerator. The resultant glass substrate/color cell array element is designated "103616-6G."

P. Preparation of Glass Substrate/Color Cell Array Element 103616-16D

Glass substrate/color cell array element "102944-106B (Glass)" was irradiated with 800 mJ/cm$^2$ from the color cell array side with $N_2$ inerting using an RPC Equipment UV Processor Model QC 1202 (medium pressure Hg lamps).

The resultant glass substrate/color cell array element is designated "103616-16D."

Q. Preparation of 3M Matchprint III Substrate (PET)/Black Matrix/Color Cell Array Element 103616-14A A PET substrate/black matrix/red and blue color cell array element was prepared utilizing the 3M Matchprint III materials and process. The resultant PET substrate/color cell array element is designated "103616-14A."

R. Preparation of 3M Matchprint III Substrate (PET)/Black Matrix/Color Cell Array Element 103616-14B A PET substrate/black matrix/blue color cell array element was prepared utilizing the 3M Matchprint III materials and process. The resultant PET substrate/color cell array element is designated "103616-14B."

S. Preparation of Green Color Cell Array Element 104814-43

Green color cell array element 104814-43 was prepared via laser induced transfer of the color cell array (lines ca. 112 $\mu$m wide with a center-to-center spacing of ca. 250 $\mu$m) from green donor 104009-27E3 to the microstructured surface of a 5 mil amorphous polyolefin film which had been microroughened for adhesion-promotion on one side. The sample was imaged with the beam incident upon the substrate (PET) side of the green donor. The laser utilized was a Nd:YAG laser, lasing in the TEM00 mode, at 1064 nm. The power at the image plane was 3.2 watts, and the linear speed of the imaging laser spot was 64 m/s. The laser spot size was ca. 25 microns. The amorphous polyolefin film and green donor samples were held in place with a vacuum, with the media translated in a direction perpendicular to the direction of laser scan. The resultant amorphous polyolefin film/green color cell array elements prepared in this manner are designated "104814-43."

Lamination of Conventional (Non-curing) Adhesive/Film/Electrode/(Alignment Layer) and Glass Substrate/Color Cell Array Elements to Produce LCD Color Filter Elements Laminations of the adhesive/film/electrode/(alignment layer) and glass substrate/color cell array elements to produce LCD color filter elements were performed for the combinations of elements listed in Table 3. The laminator employed was a non-commercially available laboratory laminator with a lower, fixed-position steel lamination surface and a transversing, ambient temperature rubber roller on which the load is adjustable for control of lamination pressure. The fixed-position steel lamination surface was, in the cases of all indicated laminations, preheated to 280° F. In each case the glass substrate/color cell array was mounted with the substrate in contact with the steel lamination surface and was preheated in contact with the steel surface for 60 seconds prior to initiating the lamination process. Contact pyrometer measurements indicated that the temperature of a 75 mm×25 mm×1 mm glass substrate achieved an upper (air) surface temperature of 275° F. when preheated under these conditions. In each case the adhesive/film/electrode/(alignment layer) element was then registered with the appropriate glass substrate/color cell array element with the adhesive layer of the adhesive/film/electrode/(alignment layer) element contacting the color cell layer of the glass substrate/color cell array element. The corresponding lamination was then effected by traversing, once in the forward direction and once in the reverse direction, the loaded rubber roller over the registered elements to produce the respective LCD color filter element. A summary of the conditions employed to laminate the samples are also provided in Table 3.

TABLE 3

Lamination pressure (= force/lamination contact area) = ca. 6150 g/cm$^2$
Lamination traverse speed = 1 cm/sec.

| Adhesive/Film/ Electrode/ (Alignment Layer) Element | Glass Substrate/ Color Cell Array Element | Designation of Resultant Laminated LCD Color Filter Element |
| --- | --- | --- |
| Reichold 40440/FPE/ITO | 102944-71-1G | 102944-86III(A) |
| Reichold 40440/FPE/ITO | 102944-81-1G | 102944-87I(A) |
| Reichold 40440/FPE/ITO | 103616-6E | 103616-20B |
| Reichold 40440/FPE/ITO | 103616-16D | 103616-20C |
| Reichold 40440/FPE/ITO | 103616-6G | 103616-20D |
| Reichold 40440/FPE/ITO | 103616-18C | 103616-20E |
| Reichold 40440/FPE/ITO | 103616-18G | 103616-20F |
| Reichold 40440/FPE/ITO | 103616-18D | 103616-20G |
| ITO/Ag/ITO/SiO$_2$/SE5211 Polyimide | 102944-81-1G | 103616-20H |

Microscopic evaluations were performed on laminated samples and indicated the laminations proceeded well and that adhesive had flowed to substantially fill the space between the respective laminated elements.

Lamination of Conventional (Non-curinz) Adhesive/Film/Electrode/(Aliinment Layer) and PET Substrate/Black Matrix/Color Cell Array Elements to Produce LCD Color Filter Elements Laminations of the adhesive/film/electrode/(alignment layer) and PET substrate/black matrix/color cell array elements to produce LCD color filter elements were performed for the combinations of elements listed in Table 4. The laminator employed was a 3M Model MR-447™ Matchprint™ Laminator. In each case the PET substrate/black matrix/color cell array element was taped to a sheet of 3M Matchprin™ paper base with the PET substrate of the substrate/black matrix/color cell array element contacting the 3M Matchprint™ base. In each case the adhesive/film/electrode/ (alignment layer) element was then registered with the appropriate PET substrate/black matrix/color cell array element with adhesive layer of the adhesive/film/electrode/ (alignment layer) element contacting the color cell layer of the substrate/black matrix/color cell array element. The corresponding lamination was then effected by placing the contacting elements on the 3M Matchprint™ base between the 3M 4447 laminator rollers and transporting the corresponding sample through the laminator. A summary of the conditions employed to laminate the samples are provided in Table 4.

TABLE 4

3M 447 Upper roll temperature = 280° F.
3M 447 Lower roll temperature = 180° F.
Lamination transport speed = 2.2 cm/s

| Adhesive/Film/ Electrode/ (Alignment Layer) Element | PET Substrate/ Black Matrix/ Color Cell Array Element | Designation of Resultant Laminate LCD Color Filter Element |
| --- | --- | --- |
| Reichold 40440/FPE/ITO | 102944-81-1BM | 102944-86III(B) |
| Amorphous Polyolefin/ ITO/Ag/ITO/SiO$_2$/ SE5211 Polyimide | 102944-71-1BM | 103616-21B |
| Reichold 40440/FPE/ITO | 102944-71-1BM | 103616-21C |

Microscopic evaluations were performed on laminated samples and indicated the laminations proceeded well and that adhesive had flowed to substantially fill the space between the respective laminated elements.

Lamination of Curable Adhesive/Film/Electrode and Color Cell Array Elements to Produce LCD Color Filter Elements Laminations of the curable-adhesive/film/electrode and color cell array elements to produce LCD color filter elements were performed for the combinations of elements listed in Table 5. Details of the conditions employed to prepare and cure the corresponding samples are also provided below:

Lamination Conditions

Laminations were performed as specified in Table 5 either prior or subsequent to irradiation of the adhesive with the denoted light source. Prior to lamination the remaining release liner was removed from the appropriate curable adhesive/filmlelectrode element. In each case the adhesive/film/electrode element was then registered with the appropriate color cell array element with adhesive layer of the adhesive/film/electrode contacting the color cell layer of the substrate cell array element. The resulting sample was then placed in a Pressure Sensitive Tape Council Rolldown Machine and transversed at ambient temperature, once in the forward direction and once in the reverse direction, with 4.5 lb. rolls at 12 inches/minute.

Irradiation Conditions

Irradiation of the samples was performed either prior or subsequent to irradiation of the curable adhesive with "Irradiation Condition A" or "Irradiation Condition B" specified below. Except as noted all exposures were performed with the radiation incident upon the electrode surface.

Irradiation Condition A

RPC Equipment UV Processor, Model QC1202AN3TR, 5 passes using 2 medium pressure Hg lamps at "normal" setting (420 volts, 7.7 amps), web speed at 50 fpm. Exposure dose using Unvicure™ UV Curing Radiometer was determined to be ca. 93 millijoule/pass.

Irradiation Condition B

A linear bank of 6 (six) Philips TLD 15w/03 Super Actinic lamps spaced 50 mm center-to-center and 4 inches from the supporting floor on which the sample is placed during irradiation.

Thermal Curing Conditions

Thermal curing of all samples was performed by placing the corresponding samples in a preheated forced air oven at 100° C. for 10 minutes.

TABLE 5

| Release Liner/Adh./ Film/ Electrode Element | Substrate/Color Cell Array Element | Expos. Cond. | Pre- or Post- Lamination Radiation Exposure | Resultant Laminated LCD Color Filter Element |
| --- | --- | --- | --- | --- |
| 104814-53A | Cyan lines on glass (102944-71-1G) | A | Pre-lamination radiation Exposure | 104814-54A |
| 104814-53A | Cyan lines on glass (102944-71-1G) | A | Post-lamination radiation exposure | 104814-54B |
| 104814-53A | Blue lines on glass (102944-81-1G) | A | Post-lamination radiation exposure | 104814-54C |
| 104814-53A | Green color filter pattern on Zeonex 250 (104814-43) | A | Post-lamination radiation exposure | 104814-54D |
| 104814-53B | Cyan lines on glass (102944-71-1G) | A | Post-lamination radiation exposure | 104814-54E |
| 104814-53B | Green color filter pattern on Zeonex 250 (104814-43) | A | Post-lamination radiation exposure | 104814-54F |

TABLE 5-continued

| Release Liner/Adh./ Film/ Electrode Element | Substrate/Color Cell Array Element | Expos. Cond. | Pre- or Post- Lamination Radiation Exposure | Resultant Laminated LCD Color Filter Element |
| --- | --- | --- | --- | --- |
| 104814-53B | Green color filter pattern on Zeonex 250 (104814-43) | A | Pre-lamination radiation exposure | 104814-54G |
| 104814-52 (adhesive only) | glass slide only | A | Post-lamination radiation exposure | 104814-54H, 104814-61B |
| 104814-57A | Cyan lines on glass (102944-71-1G) | B | Pre-lamination Radiation Exposure | 104814-58A |
| 104814-57A | Cyan lines on glass (102944-71-1G) | B | Post-lamination radiation exposure | 104814-58B |
| 104814-57A | Green color filter pattern on Zeonex 250 (104814-43) | B | Post-lamination radiation exposure | 104814-58C |
| 104814-57B | Cyan lines on glass (102944-71-1G) | B | Post-lamination radiation exposure | 104814-58D |
| 104814-57B | Green color filter pattern on Zeonex 250 (104814-43) | B | Post-lamination radiation exposure | 104814-58E |
| 104814-57B | Green color filter pattern on Zeonex 250 (104814-43) | B | Pre-lamination radiation exposure | 104814-58F |
| 103551-79 (adhesive only) | glass slide only | B | Post-lamination radiation exposure | 104814-58G, 104814-61C |

Birefrineence Measurements of LCD Color Filter Elements Derived From Laminations of Curable Adhesive/Film/ Electrode and Color Cell Array Elements The birefiigences of samples prepared as described in Table 5 were measured with a Leitz Ortholux™ II microscope and a Leitz Tilting Compensator B. The employed procedure is described in detail in the Leitz tilting compensator manual (publication 313.550-057). The corresponding results are contained in Table 6.

TABLE 6

| LCD Color Filter Element | Birefringence |
| --- | --- |
| 103616-96 (comparative example) | 0.000009 |
| 103616-97 (comparative example) | 0.000015 |
| 104814-54A | 0.000045 |
| 104814-54B | 0.000050 |
| 104814-54C | 0.000084 |
| 104814-54D | 0.000020 |
| 104814-54E | 0.000060 |
| 104814-54F | 0.000025 |
| 104814-54G | 0.000024 |
| 104814-54H | Nil |
| 104814-58A | 0.000015 |
| 104814-58B | 0.000028 |
| 104814-58C | 0.000019 |
| 104814-58D | 0.000033 |
| 104814-58E | 0.000017 |
| 104814-58F | 0.000020 |
| 104814-58G | Nil |

Surface Resistivity Measurements of LCD Color Filter Elements Derived From Laminations of Curable Adhesive/ Film/ Electrode and Color Cell Array Elements The surface resistivities of samples prepared as described in Table 5 were measured using a Delcon Non-Contact Conductance Monitor, Model 707. The corresponding results are contained in Table 7.

TABLE 7

| LCD Color Filter Element | Surface Resistivity, ohms/square |
|---|---|
| 103616-96 (comparative example) | 8.7 |
| 103616-97 (comparative example) | 85.6 |
| 104814-54A | 7.7 |
| 104814-54B | 7.2 |
| 104814-54C | 7.1 |
| 104814-54D | 7.5 |
| 104814-54E | 71.4 |
| 104814-54F | 131.1 |
| 104814-54G | 76.6 |
| 104814-58A | 7.4 |
| 104814-58B | 13.2 |
| 104814-58C | 8.0 |
| 104814-58D | 74.1 |
| 104814-58E | 65.2 |
| 104814-58F | 166.7 |

Hardness Measurements of Curable Adhesive/Glass Elements

The scratch hardnesses of samples 104814-61B and 104814-61C were measured according to ASTM D 3363-92a "Standard Test Method for Film Hardness by Pencil Test" as a function of cure time at 100° C. The corresponding results are contained in Table 8.

TABLE 8

| Sample Designation | Pencil Hardness after 10 minutes/100° C. | Pencil Hardness after 30 minutes/100° C. |
|---|---|---|
| 104814-61B | 5B | 4B |
| 104814-61C | 3B | B |

Laminations of Transparent Electrode (ITO)/Protection Layer Transfer Film and Color Cell Array Elements with Subsequent Substrate Stripping to Produce LCD Color Filter Elements Laminations of the film/electrode/curable adhesive transparent electrode (ITO) transfer film and color cell array elements followed by subsequent substrate stripping to produce LCD color filter elements were performed for the combinations of elements listed in Table 9. Details of the conditions employed to prepare, cure and remove the film substrate from the corresponding samples are also provided below:

Lamination Conditions

Laminations were performed as specified in Table 9 either prior or subsequent to irradiation of the adhesive with the denoted light source. Prior to lamination the remaining release liner was removed from the 104814-65A film/electrode/curable adhesive element. In each case the film/electrode/curable adhesive element was then registered with the appropriate color cell array element with adhesive layer of the film/electrode/curable adhesive contacting the color cell layer of the substrate cell array element. The resulting sample was then placed in a Pressure Sensitive Tape Council Rolldown Machine and transversed at ambient temperature, once in the forward direction and once in the reverse direction, with 4.5 lb. rolls transversing the sample at 12 inches/minute. The Pressure Sensitive Tape Council Rolldown Machine is manufactured to meet ASTM, PSTC, TLMI, FINAT and AFERA standards.

Irradiation Conditions

Irradiation of the samples was performed either prior or subsequent to irradiation of the curable adhesive with "Irradiation Condition A" specified below. Except as noted all exposures were performed with the radiation incident upon the PET substrate.

Irradiation Condition A

RPC Equipment UV Processor, Model QCL202AN3TR, 5 passes using 2 medium pressure Hg lamps at "normal" setting (420 volts, 7.7 amps), web speed at 50 fpm. Exposure dose using Unvicure UV Curing Radiometer was determined to be ca. 93 millijoules/pass.

Thermal Curing Conditions

Thermal curing of all samples was performed by placing the corresponding samples in a preheated forced air oven at 100° C. for 10 minutes.

Stripping (Removal)

Substrate stripping was performed after thermal curing of each of the elements and after each of the elements had cooled to ambient temperature. In each case the substrate stripping was accomplished by firmly gripping an film edge not in contact with the cured adhesive and manually stripping off the film with a 180° peel angle. In all cases it was apparent that ITO had been successfully transferred to the corresponding color filter array-containing element. (In the Tables, Adh. is adhesive, Subs. is substrate)

TABLE 9

| Electrode/ Film/ Adh. Liner Media | Color Cell Array/Subs. Element | Pre- or Post- Lamination Radiation Exposure | Designation of Resultant Laminated LCD Color Filter Element I |
|---|---|---|---|
| 104814-65A | Cyan lines on glass (102944-71-1G) | Pre-lamination Radiation Exposure | 104814-66A |
| 104814-65A | Cyan lines on glass (102944-71-1G) | Post-lamination radiation exposure | 104814-66B |
| 104814-65A | Green color filter pattern on Zeonex 250 (104814-43) | Post-lamination radiation exposure | 104814-66C |

Birefrinzence Measurements of LCD Color Filter Elements Derived From Laminations of Transiarent Electrode (ITO)/Protection Layer Transfer Film and Color Cell Array Elements with Subsequent Substrate Stripping The birefrigences of samples prepared as described in Table 9 were measured with a Leitz Ortholux II microscope and a Leitz Tilting Compensator B. The employed procedure is described in detail in the Leitz tilting compensator manual (publication 313.550-057). The corresponding results are contained in Table 10.

TABLE 10

| LCD Color Filter Element | Birefringence |
|---|---|
| 104814-66A | Nil |
| 104814-66B | Nil |
| 104814-66C | 0.000012 |

Surface Resistivity Measurements of LCD Color Filter Elements Derived From Laminations of Transparent Electrode (ITO) /Protection Layer Transfer Film and Color Cell Array Elements with Subsequent Substrate Stripping The surface resistivities of samples prepared as described in Table 9 were measured using a Delcon Non-Contact Conductance Monitor, Model 707. The corresponding results are contained in Table 11.

TABLE 11

| LCD Color Filter Element | Surface Resistivity, ohms/square |
|---|---|
| 104814-64C (comparative example) | 211 |
| 104814-66A | 297 |
| 104814-66B | 625 |
| 104814-66C | 2611 |

What is claimed is:

1. A method for the manufacture of an optical element comprising at least a receptor, a crosslinked organic polymeric layer, and a conductive layer, said process comprising the steps of:
    a) depositing a transparent conductive layer onto a substrate,
    b) depositing a layer of pressure-sensitive crosslinkable adhesive onto said conductive layer,
    c) placing the layer of crosslinkable material into contact with a receptor surface while said layer of crosslinkable material is in contact with said conductive layer, and
    d) curing said crosslinkable material to adhere the layer of crosslinkable material to both the receptor surface and the conductive layer,
    wherein the pressure-sensitive crosslinkable adhesive comprises:
        (1) at least one first polymer obtained from polymerization of at least one free-radically polymerizable monomer; and
        (2) at least one second polymerizable monomer different from said free radically polymerizable monomer.

2. The process of claim 1 wherein said conductive layer is a layer comprising metal, metal oxide, inorganic oxide, or mixtures thereof.

3. The process of claim 2 wherein said conductive layer comprises Indium-Tin-Oxide.

4. The process of claim 2 wherein said conductive layer comprises Indium-Tin-Oxide/Silver.

5. The process of claim 1 wherein said receptor comprises a color filter array.

6. The process of claim 2 wherein said receptor comprises a color filter array.

7. The process of claim 3 wherein said receptor comprises a color filter array.

8. The process of claim 4 wherein said receptor comprises a color filter array.

9. The process of claim 1 wherein said crosslinkable adhesive comprises a composition which will crosslink when exposed to a treatment selected from the group consisting of heating to a temperature below 150° C. and exposure to electromagnetic radiation.

10. The process of claim 3 wherein said crosslinkable adhesive comprises a composition which will crosslink when exposed to a treatment selected from the group consisting of heating and exposure to electromagnetic radiation.

11. The process of claim 4 wherein said crosslinkable adhesive comprises a composition which will crosslink when exposed to a treatment selected from the group consisting of heating and exposure to electromagnetic radiation.

12. The process of claim 7 wherein said crosslinkable adhesive comprises a composition which will crosslink when exposed to a treatment selected from the group consisting of heating and exposure to electromagnetic radiation.

13. The process of claim 9 wherein said crosslinkable adhesive is selected from the group consisting of poly(meth) acrylates, vinyl ether crosslinkable materials and epoxy crosslinkable materials.

14. The process of claim 10 wherein said crosslinkable adhesive is selected from the group consisting poly(meth) acrylates, vinyl ether crosslinkable materials and epoxy crosslinkable materials.

15. The process of claim 11 wherein said crosslinkable adhesive is selected from the group consisting poly(meth) acrylates, vinyl ether crosslinkable materials and epoxy crosslinkable materials.

16. The process of claim 12 wherein said crosslinkable adhesive is selected from the group consisting of poly(meth) acrylates, vinyl ether crosslinkable materials and epoxy crosslinkable materials.

17. The process of claim 1 wherein said crosslinkable adhesive comprises an ethylenically unsaturated crosslinkable material and photoinitiator.

18. The process of claim 3 wherein said crosslinkable adhesive comprises an ethylenically unsaturated crosslinkable material and photoinitiator.

19. The process of claim 8 wherein said crosslinkable adhesive comprises an ethylenically unsaturated crosslinkable material and photoinitiators.

20. The process of claim 9 wherein said crosslinkable adhesive comprises an ethylenically unsaturated crosslinkable material and photoinitiator.

21. A process as recited in claim 1, wherein the at least one second polymerizable monomer comprises a cationically polymerizable monomer.

22. The process of claim 21 wherein said crosslinkable adhesive has a stability such that there is less than 0.5% by weight conversion of the cationically-polymerizable monomer of the curable pressure sensitive adhesive for at least 10 days, at 20° C., 50% RH, when stored in the absence of actinic radiation which is capable of activating a catalyst system.

23. A process as recited in claim 1, wherein the crosslinkable adhesive comprises a composition which will crosslink when exposed to at least one of heat and electromagnetic radiation.

24. A method for the manufacture of an optical element comprising at least a substrate, a crosslinked organic polymeric layer, and a conductive layer, said method comprising the steps of:
    a) depositing a transparent conductive layer onto a substrate,
    b) depositing a layer of pressure-sensitive crosslinkable adhesive onto said conductive layer,
    c) placing the layer of crosslinkable material into contact with a receptor surface while said layer of crosslinkable material is in contact with said conductive layer, and
    d) curing said crosslinkable material to adhere the layer of crosslinkable material to both the receptor surface and the conductive layer, wherein the pressure-sensitive crosslinkable adhesive comprises:
        (1) at least one polymer obtained from polymerization of at least one free-radically polymerizable monomer;
        (2) at least one cationically-polymerizable monomer; and
        (3) a photo-activatable catalyst system for the cationically polymerizable monomer comprising either at least one organometallic complex salt or at least one onium salt.

25. A method of manufacturing an optical element having at least a receptor, a crosslinked organic polymeric planarization layer and a conductive layer, the method comprising the steps of:

depositing a conductive layer onto a substrate;

depositing a layer of pressure-sensitive crosslinkable adhesive, including a first component of at least one first polymer obtained from polymerization of at least one free-radically polymerizable monomer and a second component of at least one second polymerizable monomer different from said free radically polymerizable monomer, onto the conductive layer, the crosslinkable adhesive having little optical haze;

placing the layer of crosslinkable adhesive into contact with a receptor having an uneven surface while the layer of crosslinkable adhesive is in contact with the conductive layer; and curing the crosslinkable adhesive to adhere the layer of crosslinkable adhesive to both the receptor and the conductive layer.

* * * * *